US006797577B2

(12) United States Patent
Johnson et al.

(10) Patent No.: US 6,797,577 B2
(45) Date of Patent: Sep. 28, 2004

(54) ONE MASK PNP (OR NPN) TRANSISTOR ALLOWING HIGH PERFORMANCE

(75) Inventors: Frank Scott Johnson, Richardson, TX (US); Jerold A. Seitchik, Dallas, TX (US); John Soji, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 10/243,603

(22) Filed: Sep. 13, 2002

(65) Prior Publication Data

US 2004/0051148 A1 Mar. 18, 2004

(51) Int. Cl.[7] .............................................. H01L 21/331
(52) U.S. Cl. ...................... 438/309; 438/313; 438/318; 438/322; 438/323; 438/373
(58) Field of Search ................... 438/234, 309, 438/313, 318, 322, 323, 331, 373

(56) References Cited

U.S. PATENT DOCUMENTS

| 5,358,883 A | 10/1994 | Burger et al. |
| 5,656,514 A | 8/1997 | Ahlgren et al. |
| 5,856,003 A | 1/1999 | Chiu |
| 6,245,649 B1 | 6/2001 | Buller et al. |
| 6,350,640 B1 * | 2/2002 | Fuller et al. ................ 438/202 |

* cited by examiner

*Primary Examiner*—Hsien Ming Lee
(74) *Attorney, Agent, or Firm*—Yingsheng Tung; Wade James Brady, III; Frederick J. Telecky, Jr.

(57) ABSTRACT

A method is disclosed for the improvement of BiCMOS or CMOS manufactured device performance, specifically bipolar junction transistor performance, in a cost effective manner. The method provides for fewer masking operations during bipolar junction transistor formation, in a CMOS flow process, yet also provides for the bipolar junction transistor to be optimized.

25 Claims, 18 Drawing Sheets

ONE MASK PNP (OR NPN) TRANSISTOR ALLOWING HIGH PERFORMANCE

FIELD OF INVENTION

The present invention relates to improved methods for manufacturing integrated circuit devices and more particularity to improved methods related to the manufacture of high performance bipolar transistors fabricated with a BiCMOS and CMOS process.

BACKGROUND OF THE INVENTION

An accelerating trend in the integrated circuit industry is the merging of analog and digital functions onto the same semiconductor substrate. In addition, transistor components located on these devices are challenged to achieve higher performance characteristics, such as higher cut off frequencies, higher transistor gains, lower collector resistance, etc.

Bipolar junction transistors are one of the older types of transistors which can act either as an amplifier or a switching device and are widely used in discrete circuits as well as integrated circuits. Bipolar junction transistors provide high current drive capabilities, are very useful as a constant current source and as an active load in many analog/digital applications. Bipolar junction transistor characteristics are so well understood, that circuit design using bipolar junction transistors is a relatively easy task. In addition, circuit designs using bipolar junction transistors can obtain performance results that are remarkably predictable and quite insensitive to variations in device parameters. Alternatively, complementary metal-oxide semiconductor (CMOS) devices composed of P and N-channel field effect transistors offer low power consumption, high packing density and dynamic memory storage capabilities.

With the advantages of both bipolar junction and CMOS transistor families in mind, the current industry trend is to incorporate both CMOS and bipolar junction transistors onto the same semi conductor substrate. In this manner the advantages of both families of transistors are realized. However, there are disadvantages to this approach in that as circuit devices are downscaled, bipolar junction transistors become more difficult (and thus more expensive) to fabricate. This is especially true if the device is expected to have high performance (bipolar junction transistor) characteristics and yet incorporate optimized CMOS transistors.

To meet the industry needs, a method for providing high performance bipolar junction transistors in a cost effective manner, when incorporating CMOS transistors on a device needs to be addressed (e.g., a cost effective method to form high performance bipolar junction transistors in a BiCMOS and CMOS process).

One prior art method addressing the cost involved with bipolar junction transistor fabrication on a BiCMOS and CMOS device is illustrated in FIGS. 1A–1D. This process involves the fabrication of vertical bipolar junction transistors within a BiCMOS and CMOS process flow. These transistors are typically fabricated by forming a deep N well 12 within a substrate 10. A P-type collection region 11 is then formed within the deep N-well 12. This act, or event, is followed by the formation of isolation regions 13. All the acts, or events, mentioned so far, are performed using masking operations which would also be utilized during CMOS transistor formation (e.g, at to this point in the BiCMOS and CMOS process, no additional masking operations are required to form a bipolar transistor on the device).

Photoresist 14 is applied to the surface of the device in preparation for a pattern to be formed. This pattern is formed using an extra mask 15 (e.g., a mask not normally used in a BiCMOS and CMOS transistor forming process), which blocks UV radiation and removes exposed portions of the photoresist 14. The pattern is then used to implant an N-type base 16. After this act or event, the pattern is removed (e.g., the photoresist 14 is removed).

Next, N-type base contact 17, P-type emitter 18, and P-type collector contact 19 are formed with source/drain implants using masking operations which are utilized during CMOS transistor formation. Finally an isolation region 20 is formed between the base 17 contact implant and the emitter contact implant 18 in order to provide isolation between the two regions during subsequent metallization connections.

Advantages of this prior art method are the relative low cost since only one extra mask 15 is required to form the base of the transistor, however, this bipolar junction transistor formation method suffers a significant disadvantage in that it has poor performance characteristics. In other words the process is well optimized for CMOS transistors, but not for bipolar junction transistors due to a non-optimized collector region 11. In general, this prior art process suffers from high doping at implant surfaces resulting in low base-collector breakdown voltage, high base-collector capacitance, and low early voltage (e.g., a measure of a transistor's output node properties and how ideal these properties are when the transistor is used as a current source, proportional to the base collector capacitance). The process also suffers from low dopant concentration at larger depths that results in a high collector resistance and high parasitic transistors gains. Some reasons for these low bipolar junction transistor performance characteristics result from restrictions associated with the BiCMOS and CMOS process (such as the tuning process of the collector for source/drain implants, etc.) and the method's inability to implant high dopant concentrations deep into the collector region.

A second prior art method results in high bipolar junction transistor performance characteristics, however this method requires extra masking operations (and hence extra costs) as illustrated in FIGS. 2A–2E.

In FIG. 2A, a photoresist 30 is applied to the surface of the device in preparation for a pattern to be formed. This pattern is formed using an extra mask 31 (e.g., a mask not normally used in the BiCMOS and CMOS process), which blocks UV radiation and removes exposed portions of the photoresist 30. The pattern is then used to form a buried P-type collector region 32 using a high energy ion implantation (or another similar method) within a deep N-well 33. The pattern is then removed (e.g., the photoresist 30 is removed).

This act, or event, is followed by the formation of isolation regions 34 (e.g., shallow trench isolation (STI) regions) using techniques which are normally used within a BiCMOS and CMOS transistor formation process. Next, photoresist 45 is applied to the surface of the device in preparation for a second pattern to be formed. This pattern is formed using a second extra mask 36 (e.g., a mask not normally used in a BiCMOS and CMOS process), which blocks UV radiation and removes exposed portions of the photoresist 45. The pattern is then used to form deep P-wells 35 which will couple the P-type collector source/drain contact implants (described below) with the deep buried P-type collector region 32. After this act or event, the pattern is removed (e.g., the photoresist 45 is removed).

Next, photoresist 46 is applied to the surface of the device in preparation to form a third pattern. This pattern is formed using a third extra mask 38 (e.g., a mask not normally used in the BiCMOS and CMOS process), which blocks UV radiation and removes exposed portions of the photoresist 46. The pattern is then used to form a highly doped, N-type base 39 via implantation. After this act or event, the pattern is removed (e.g., the photoresist 46 is removed).

Next, an N-type base contact 40, P-type emitter contact 41, and P-type collector contact regions 42 are formed using masking operations that are utilized to form source/drain regions during CMOS transistor formation. Note that the P-type collector source/drain contact implants 42 are coupled to the buried P-type collector 32 via deep P-wells 35, providing lower transistor collector resistance than the prior art transistor structure of FIG. 1D. Finally an isolation region 43 is formed between the base contact region 40 and the emitter contact region 41, respectively, to provide isolation for subsequent metallization steps.

The process of FIGS. 2A–2E results in a P-type collector region 32 which is well optimized for a vertical PNP bipolar junction transistor, because a vertical dopant profile is achieved which is lightly doped on the surface and heavily doped on the bottom. Because this collector is more heavily doped, it achieves high base-collector breakdown voltage, low base-collector capacitance, and high early voltage. In addition, the profile results in low collector resistance and low parasitic transistor gains. The result is a bipolar junction transistor with good performance properties, but is achieved by using several extra masking operations 31, 36, 38 and therefore is achieved at a much greater expense than the prior art process of FIGS. 1A–1D.

Clearly, the challenge of downscaling bipolar junction transistors in a cost effective manner, with high performance characteristics and incorporating optimized transistors needs to be addressed (e.g., the challenge of forming high performance, low cost, bipolar junction transistors in a BiCMOS and CMOS process). Accordingly, the present invention addresses this need.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a method of fabricating high performance bipolar junction transistors in a BiCMOS and CMOS process without the use of several additional masking steps.

One aspect of the invention comprises the formation of a PNP type bipolar junction transistor fabricated within a BiCMOS and CMOS process. The process begins with forming a deep N-type well within a substrate. Isolation regions and P-type implants are formed using techniques that are common in a BiCMOS and CMOS process.

Photoresist is applied to the device surface and a pattern is formed using UV light (or another similar media) and one extra mask (e.g., a mask not normally used in a BiCMOS and CMOS process). Using this pattern, a heavily doped, P-type collector region is formed, which is different than the P-type implants previously formed (e.g., different dopant concentrations). This collector region is optimized for bipolar junction transistor high performance, for example, by varying the dopant concentration in the region, etc. Next, using the same pattern a heavily doped N-type base is formed within the collector region. Note that only one additional mask used for both the P-type collector formation and the N-type base formation (e.g., the method uses only one extra mask which is not normally used in a BiCMOS and CMOS process). After this act, or event, the pattern is removed (e.g., the photoresist is removed).

Next, N-type base, P-type emitter, and P-type collector contact regions are formed using source/drain implants which are also utilized to fabricate CMOS transistors. In addition, the P-type collector contact implants are coupled to the P-type collector via the P-wells providing lower transistor collector resistance. Finally an isolation region is formed between the base contact implant and the emitter contact implant, as may be desired.

By forming a P-type collector and N-type base in this manner the bipolar junction transistor is optimized (e.g., cutoff frequencies, gains, etc.) for the intended application and yet incorporates much of the standard BiCMOS and CMOS process to minimize cost (e.g., only one additional mask/pattern is required for the bipolar junction transistor formation). In other words the transistor performance parameters are greatly enhanced over transistors that do not have an optimized collector region, yet bipolar transistors formed in this manner are very cost effective to fabricate.

Another aspect of the present invention envisions a bipolar junction transistor formed in the above manner, with the exception that the formation of a deep N-well is omitted. In other words, the bipolar junction transistor formation begins with an N-type substrate, the N-type substrate would perform similar functions to that of the N-type deep well. This aspect of the invention may be employed in instances where the bipolar junction transistor does not require isolation or if the bipolar junction transistor isolation is achieved using an alternate method.

In yet another aspect of the invention, a vertical NPN bipolar transistor is fabricated in a BiCMOS and CMOS flow, forming a N-type collector with the same mask as a P-type base. The process begins with forming a deep P-type well within a substrate. Isolation regions and N-type implants are formed using techniques that are common in a BiCMOS and CMOS process (e.g., all the acts, or events, mentioned so far, are performed using masking operations utilized during the BiCMOS and CMOS process).

Photoresist is applied to the device surface and a pattern is formed using UV light and one extra mask. Using this pattern a heavily doped, N-type collector region is formed, which is different than the N-type implants previously formed (e.g., different dopant concentrations, etc.). This collector region is optimized for bipolar junction transistor high performance, for example, by varying the dopant concentration in the region, etc. Next, using the same pattern, a heavily doped P-type base is formed. Note, that only one additional mask is required when forming the pattern that is used for both the N-type collector formation and the P-type base formation (e.g., the method uses only one extra mask which is not normally used in the BiCMOS and CMOS transistor forming process). After this act, or event, the pattern is removed (e.g., the photoresist is removed).

Next, P-type base, N-type emitter, and N-type collector contact implants are formed using source/drain implants and masking operations which would also be utilized during a CMOS transistor formation process. Note, that the N-type collector contact implants are coupled to the N-type collector via the N-wells providing lower transistor collector resistance. Finally an isolation region is formed between the base contact implant and the emitter contact implant.

By forming a N-type collector and P-type base in this manner, the bipolar junction transistor can be well optimized (e.g., cutoff frequencies, gains, etc.) for the intended application and yet incorporate much of the standard BiCMOS and CMOS process to minimize cost (e.g., only one additional mask/pattern is required for the bipolar junction transistor formation). In other words the transistor performance parameters are greatly enhanced over transistors that do not have an optimized collector region, yet bipolar transistors formed in this manner are very cost effective to fabricate.

In yet another aspect of the present invention a bipolar junction transistor is formed in the above manner, with the exception that the formation of a deep P-well is omitted. In other words, the bipolar junction transistor formation begins with a P-type substrate, wherein the P-type substrate performs similar functions to that of the P-type deep well. This aspect of the invention may be employed in instances where the bipolar junction transistor does not require isolation or if the bipolar junction transistor isolation is performed using an alternate method.

When discussing the various aspects of the invention it should be noted that the invention comprises a method in which a collector is formed which is optimized for high performance, however this collector is not the result of a buried collector process, but rather a process in which the collector is formed in a manner similar to the base formation, even to the point of using the same mask and pattern. Basically, the invention discloses a method in which a customized collector region is formed using a masking operation which can also be used to subsequently form a transistor base, thus achieving high performance characteristics with minimal masking operations (and hence lower costs).

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
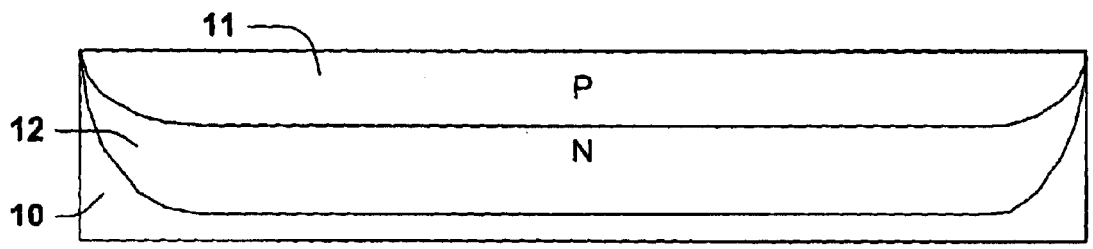
FIGS. 1A–1D are a series of fragmentary cross sectional diagrams that illustrate a prior art formation method for a vertical PNP bipolar junction transistor.
Figure 1B:
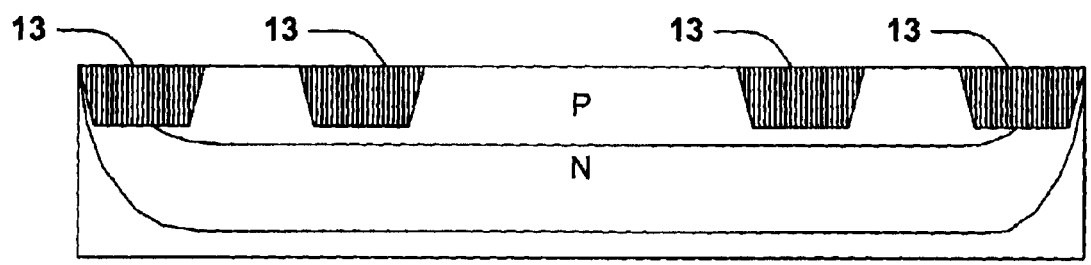
Figure 1C:
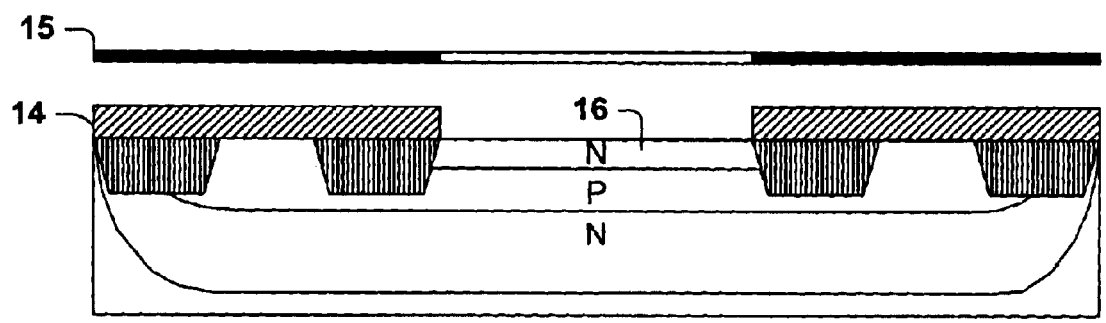
Figure 1D:
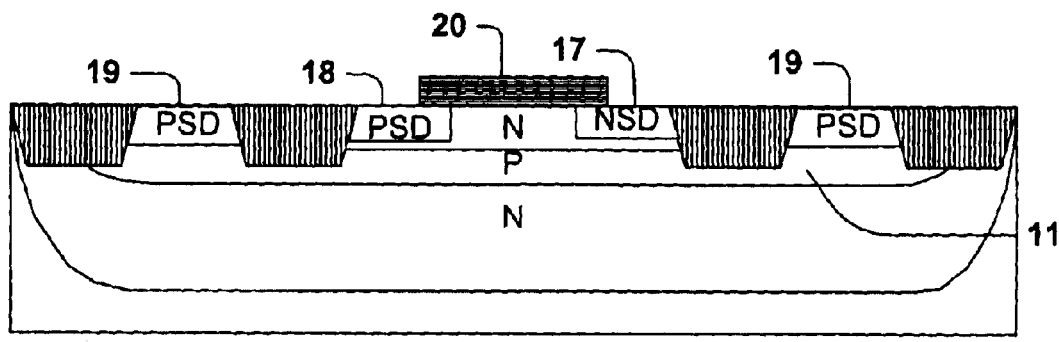
Figure 2A:
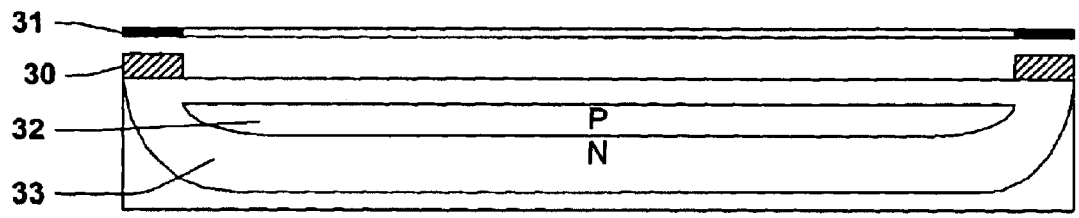
FIGS. 2A–2E are a series of fragmentary cross sectional diagrams that illustrate another prior art formation method for a vertical, PNP bipolar junction transistor.
Figure 2B:
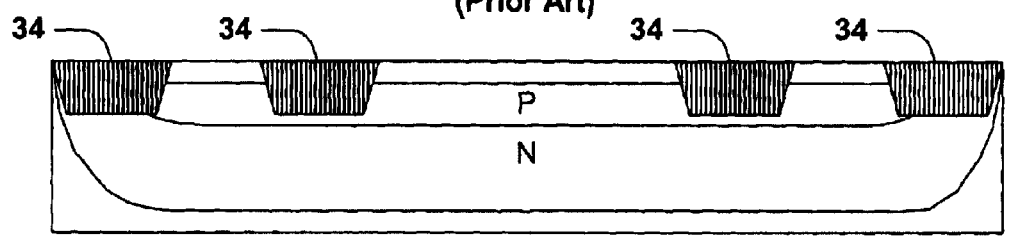
Figure 2C:
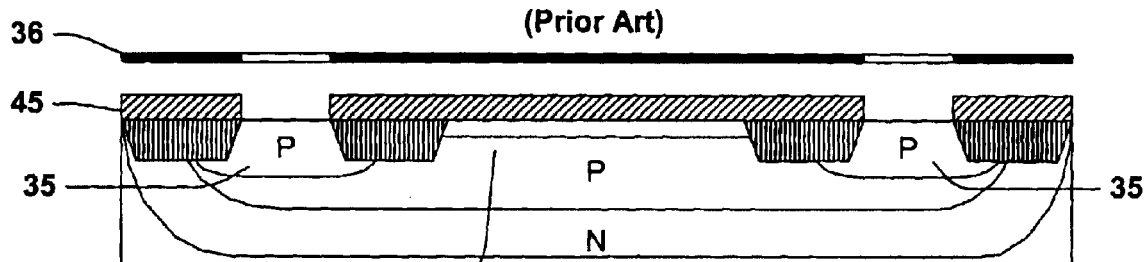
Figure 2D:
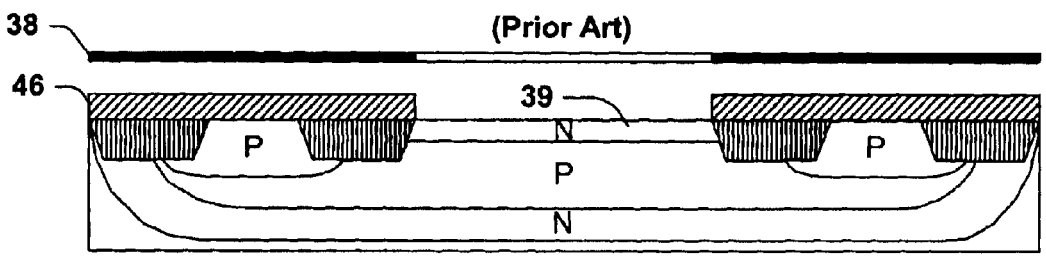
Figure 2E:
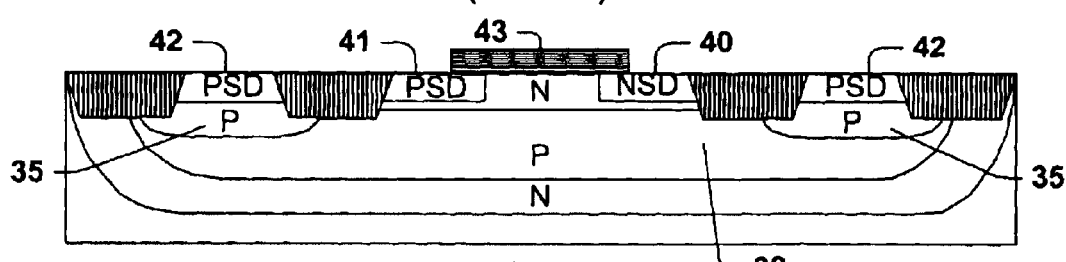
Figure 3A:
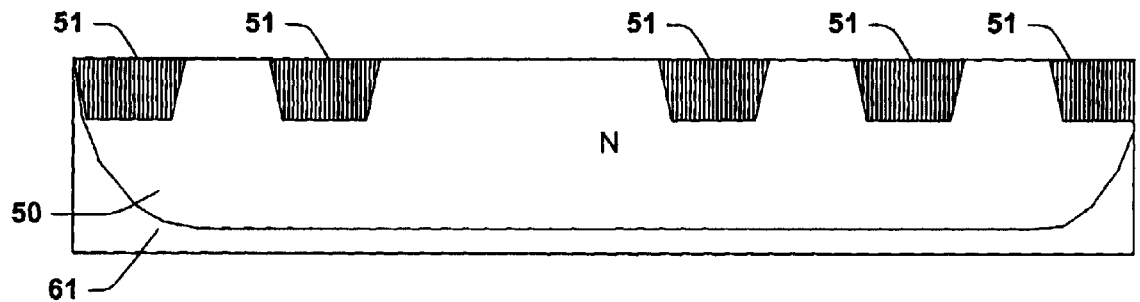
FIGS. 3A–3D are a series of fragmentary cross sectional diagrams which illustrate a formation method of an optimized, vertical PNP bipolar transistor according to the present invention.
Figure 3B:
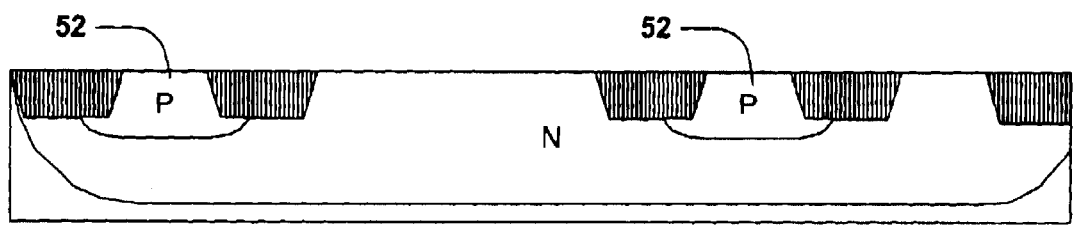
Figure 3C:
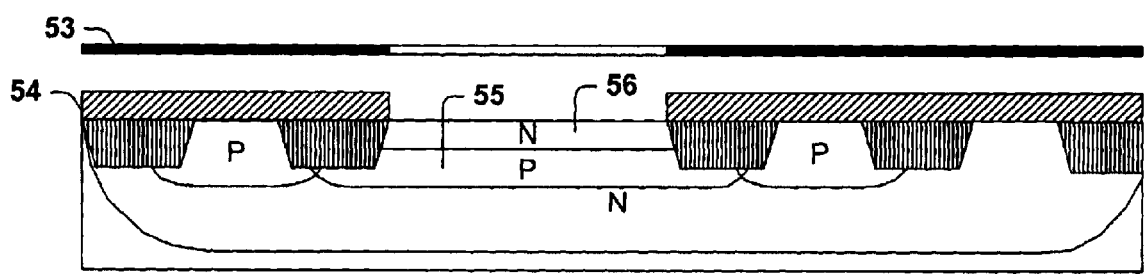
Figure 3D:
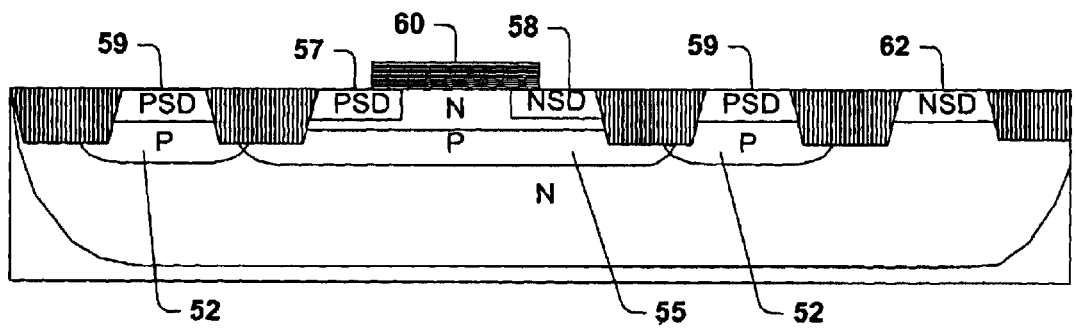
Figure 4A:
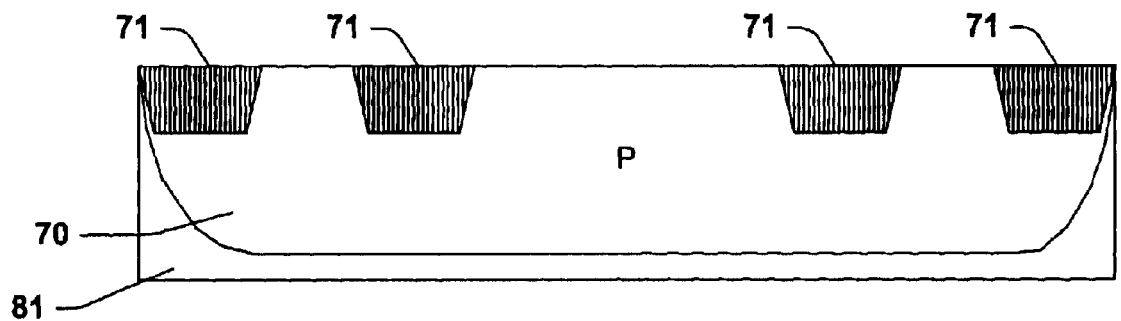
FIGS. 4A–4D are a series of fragmentary cross sectional diagrams that illustrate a formation method of an optimized, vertical NPN bipolar transistor according to another aspect of the present invention.
Figure 4B:
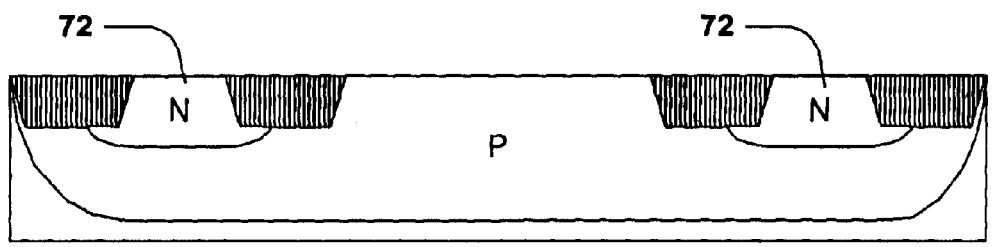
Figure 4C:
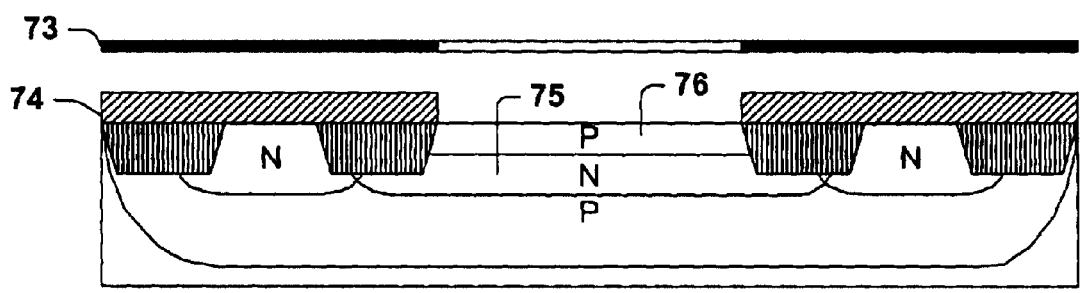
Figure 4D:
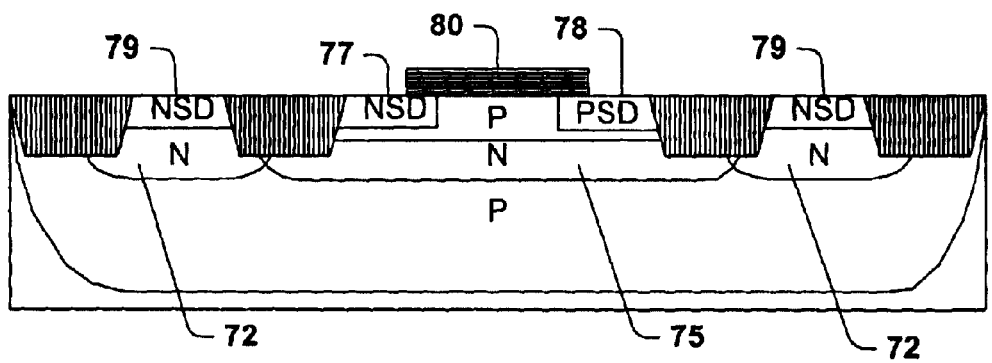

The present invention will now be described with respect to the accompanying drawings in which like numbered elements represent like parts.

In order to facilitate an understanding of various advantageous features of the present invention, a brief discussion of conventional bipolar junction transistor formation methods is discussed. Subsequently, the various features of the present invention will be discussed in detail in conjunction with several exemplary figures.

The present invention relates to a cost effective method of forming high performance bipolar junction transistors with a BiCMOS and CMOS process.

As previously discussed, prior art methods to incorporate bipolar junction transistors on devices with CMOS transistors have proved unacceptable; the simple process resulted in a poor performance device, while the other prior art process resulted in a high performance device, but required three extra masks and thus was unduly complex and expensive. The demand for high performance bipolar junction transistors incorporated into a BiCMOS and CMOS process in a cost effective manner is a major industry challenge. A key element of this challenge is the ability to easily form a customized collector region for a bipolar junction transistor, while simultaneously minimizing the process complexity.

The present invention seeks to reduce the extra masking operations of the prior art that are currently required for bipolar junction transistor optimization to a minimum, thus significantly reducing the cost of the device, and obtaining a high degree of bipolar junction transistor performance.

FIGS. 3A–3D illustrate a simplified overview of the present invention in order to provide a basic understanding of some aspects of the invention. Referring to FIGS. 3A–3D, the process begins with forming a deep N-type well 50 within a substrate. Isolation regions 51 and P-type implants 52 are formed using techniques that are common in a BiCMOS and CMOS process.

A photoresist 54 is applied to the device surface and a pattern is formed using UV light and one extra mask 53 (e.g., a mask not normally used in a BiCMOS and CMOS process). Using this pattern, a heavily doped, P-type collector region 55 is formed, which is different than the P-type implants 52 previously formed (e.g., different dopant concentrations). This collector region 55 is optimized for bipolar junction transistor high performance, for example, by varying the dopant concentration in the region, etc. Next, using the same pattern 54 a heavily doped N-type base is formed within the collector region 56. Note that only one additional mask 53 is used for both the P-type collector 55 formation and the N-type base 56 formation (e.g., the method uses only one extra mask 53 which is not normally used in a BiCMOS and CMOS process). After this act, or event, the pattern is removed (e.g., the photoresist 54 is removed).

Next, N-type base 58, P-type emitter 57, and P-type collector 59, and deep n-well contact regions 62 are formed using source/drain implants which are also utilized to fabricate CMOS transistors. In addition, the P-type collector 59 contact implants are coupled to the P-type collector 55 via the P-wells 52 providing lower transistor collector resistance. Finally an isolation region 60 is formed between the base contact implant 58 and the emitter source/drain contact implant 57, as may be desired.

Note that in FIGS. 3A–3D only a single n-well contact 62 is illustrated, however, it should be noted that the n-well region 50 typically overlaps the transistor device more than what is illustrated, and an n-well contact 62 typically is provided on both sides of the device for biasing purposes. Further, the n-well contact regions (or alternatively p-well contact regions for an NPN device) will not be illustrated in further examples for ease of illustration, however, it should be understood that such biasing contact regions typically will be included in the present invention.

By forming a P-type collector 55 and N-type base 56 in this manner the bipolar junction transistor is optimized (e.g., cutoff frequencies, gains, etc.) for the intended application and yet incorporates much of the standard CMOS process to minimize cost (e.g, only one additional mask/pattern is required for the bipolar junction transistor formation). In other words the transistor performance parameters are greatly enhanced over transistors that do not have an optimized collector region, yet bipolar transistors formed in this manner are very cost effective to fabricate.

Another aspect of the present invention envisions a bipolar junction transistor formed in the above manner, with the exception that the formation of a deep N-well 50 is omitted. In other words, the bipolar junction transistor formation begins with an N-type substrate 61; the N-type substrate would perform similar functions to that of the N-type deep well 50. This aspect of the invention may be employed in instances where the bipolar junction transistor does not require isolation or if the bipolar junction transistor isolation is achieved using an alternate method.

In yet another aspect of the invention, a vertical NPN bipolar transistor is fabricated in a BiCMOS and CMOS flow, forming an N-type collector with the same mask as a P-type base. This aspect of the invention is illustrated in FIGS. 4A–4D.

The process begins with forming a deep P-type well 70 within a substrate. Isolation regions 71 and N-type implants 72 are formed using techniques that are common in a BiCMOS and CMOS process (e.g., all the acts, or events, mentioned so far, are performed using masking operations utilized during the BiCMOS and CMOS process).

Photoresist 74 is applied to the device surface and a pattern is formed using UV light and one extra mask 73 (e.g., a mask not normally used in a BiCMOS and CMOS process). Using this pattern a heavily doped, N-type collector region 75 is formed, which is different than the N-type implants 72 previously formed (e.g., different dopant concentrations, etc.). This collector region 75 can then be optimized for bipolar junction transistor high performance, for example, by varying the dopant concentration in the region, etc. Next, using the same pattern, a heavily doped P-type base is formed 76. Note, that only one additional mask 73 is required when forming the pattern that is used for both the N-type collector 75 and the P-type base 76 formation (e.g., the method uses only one extra mask which is not normally used in the BiCMOS and CMOS process). After this act, or event, the pattern is removed (e.g., the photoresist 74 is removed).

Next, P-type base 78, N-type emitter 77, and N-type collector 79 contact implants are formed using source/drain implants and masking operations which would also be utilized during a CMOS transistor formation process. Note, that the N-type collector contact 79 implants are coupled to the N-type collector 75 via the N-wells 72 providing lower transistor collector resistance. Finally an isolation region 80 is formed between the base contact implant 78 and the emitter contact implants 77.

By forming a N-type collector 75 and P-type base 76 in this manner, the bipolar junction transistor can be well optimized (e.g., cutoff frequencies, gains, etc.) for the intended application and yet incorporate much of the standard BiCMOS and CMOS transistor formation process to minimize cost (e.g., only one additional mask/pattern is required for the bipolar junction transistor formation). In other words the transistor performance parameters are greatly enhanced over transistors that do not have an optimized collector region, yet bipolar transistors formed in this manner are very cost effective to fabricate.

In yet another aspect of the present invention a bipolar junction transistor is formed in the above manner, with the exception that the formation of a deep P-well 70 is omitted. In other words the bipolar junction transistor formation begins with a P-type substrate 81, the P-type substrate would perform similar functions to that of the P-type deep well 70. This aspect of the invention may be employed in instances where the bipolar junction transistor does not require isolation or if the bipolar junction transistor isolation is performed using an alternate method.

FIGS. 5-40 provide more details than the simplified overview, described above, in order to facilitate an understanding of various advantageous features of the present invention.

Figure 5:
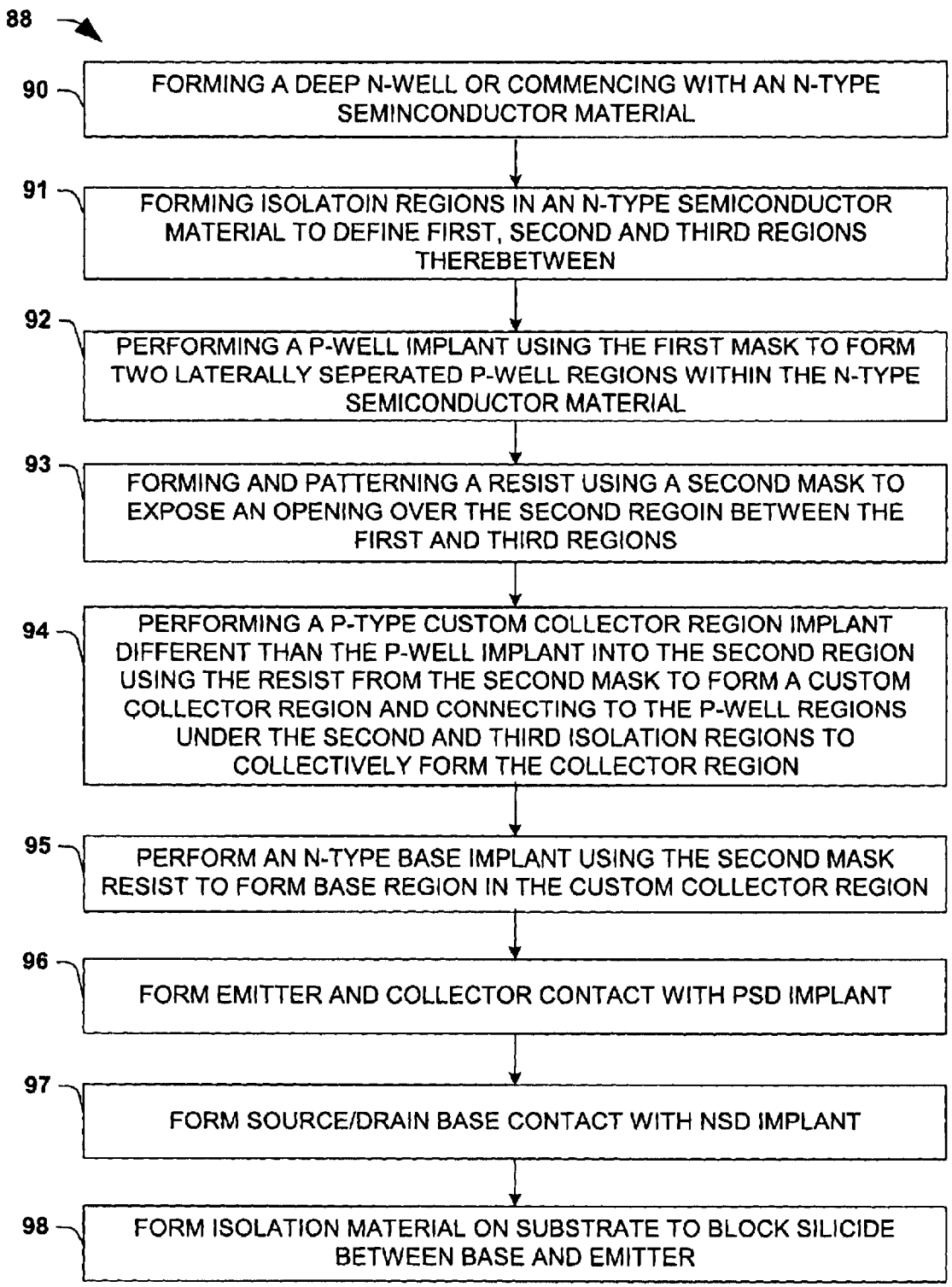
FIG. 5 is a flow diagram illustrating a method of forming a bipolar transistor in a BiCMOS and CMOS process according to one aspect of the present invention.

FIG. 5 is a flow chart, which in combination with FIGS. 6-22, illustrates an improved method 88 in accordance with one aspect of the present invention of fabricating a high performance bipolar transistor within a BiCMOS and CMOS process. The present invention is not limited by the illustrated ordering of the acts as some acts may occur in different orders and/or concurrently with other acts or events. In addition, all illustrated acts or events may not be required to implement a methodology in accordance with the present invention. In the following claims, the ordering of acts is only a limitation to the extent required explicitly or dictated by internal references within the claims.

Figure 6:
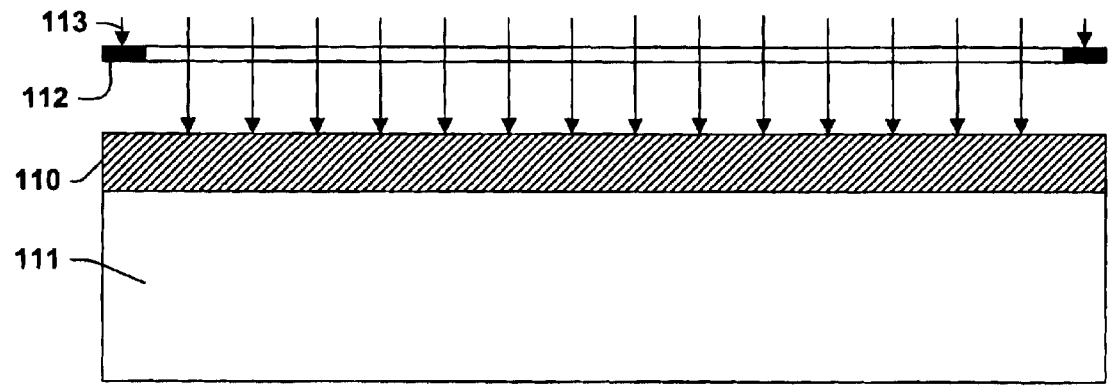
FIG. 6 is a fragmentary cross sectional diagram illustrating a masking operation to form a deep N-well.
Figure 7:
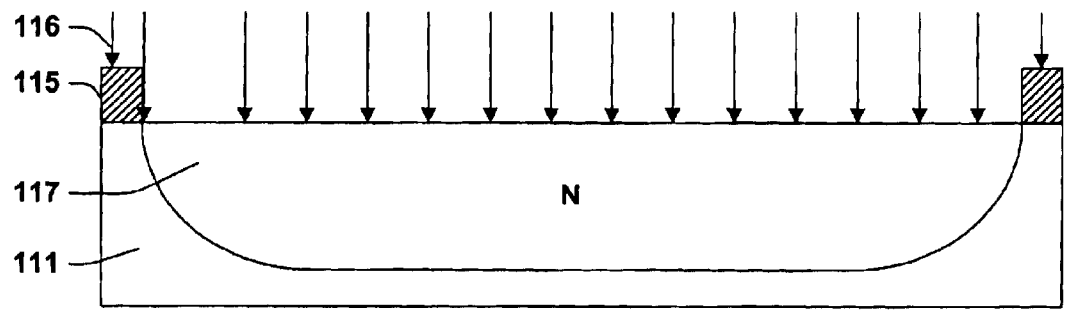
FIG. 7 is a fragmentary cross sectional diagram illustrating the formation of a deep N-well.

Referring to FIG. 5, a deep N-well is formed within a substrate at 90. Alternately, the process 88 may commence with an N-type semiconductor material depending on the isolation method or the isolation requirements of the bipolar junction transistor. FIGS. 6 and 7 illustrate this process in detail. Referring to FIG. 6, a photoresist 110 is applied to the surface of a substrate material 111. A mask 112 is then employed and the photoresist is selectively subjected to UV radiation 113 via the mask to form a mask pattern upon development, as illustrated in FIG. 7 115. Next, the substrate 111 is implanted with an N-type material 116 to form a deep N-type well 117. After this act, or event, the pattern is removed (e.g., the photoresist 115 is removed).

Figure 8:
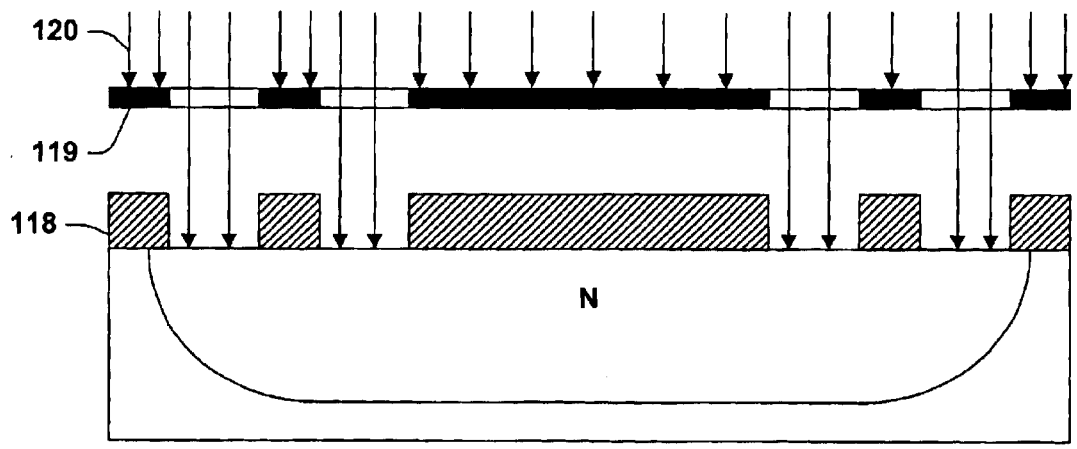
FIG. 8 is a fragmentary cross sectional diagram illustrating a masking operation used to form shallow trench isolation regions.
Figure 9:
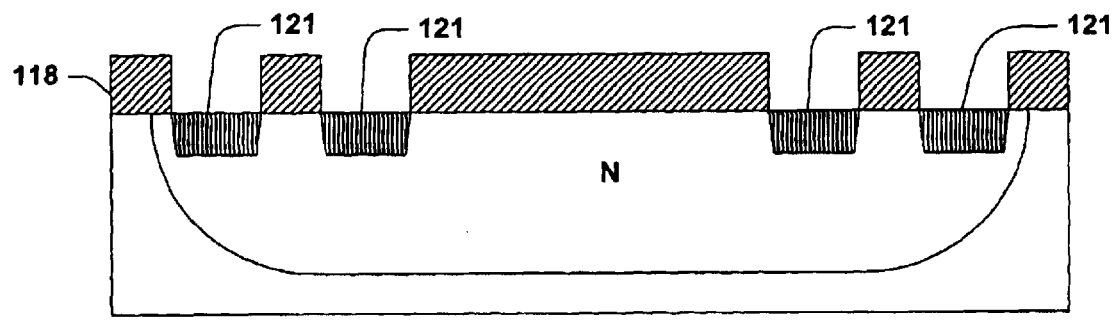
FIG. 9 is a fragmentary cross sectional diagram illustrating the shallow trench isolation regions.

Referring back to FIG. 5, the next act or event comprises the formation of electrical isolation regions at 91. This formation may be performed, for example, using shallow trench isolation methods, LOCOS, or any other similar method. FIGS. 8 and 9 detail a portion of the formation of the isolation regions 121 using a shallow trench isolation method. Referring to FIG. 8, a photoresist 118 is applied to the device surface. A mask 119 is then employed and the photoresist is subjected to UV radiation 120 via the mask to form a mask pattern 118. Next, referring to FIG. 9, trenches are etched using the mask pattern 118 and the trenches are subsequently filled with isolation material (for example, $SiO_2$ or another similar material), thereby forming the trench isolation regions 121. After this act, or event, the pattern is removed (e.g., the photoresist 118 is removed). Note, referring to FIG. 10, a first 129, a second 127, and a third 128 region are defined by the isolation regions as described in FIG. 5 and is illustrated for clarity.

Figure 10:
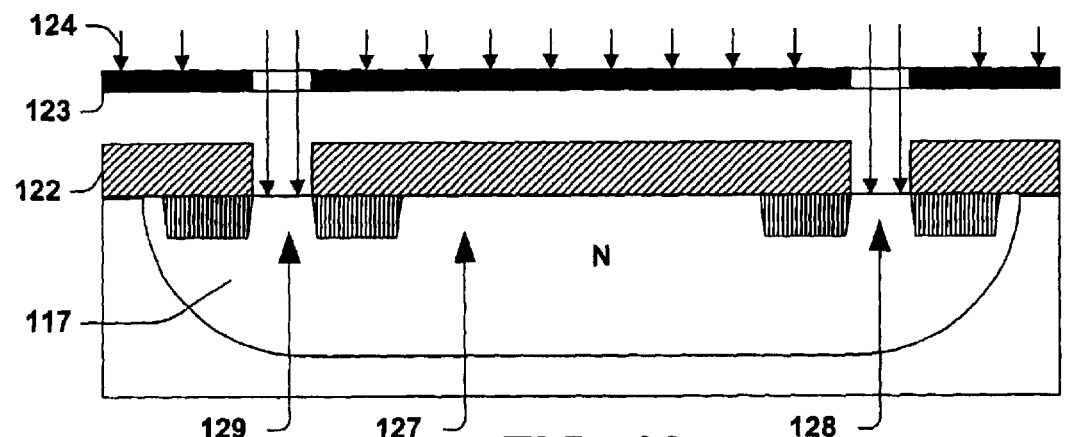
FIG. 10 is a fragmentary cross sectional diagram illustrating a masking operation used to form P-type well regions.
Figure 11:
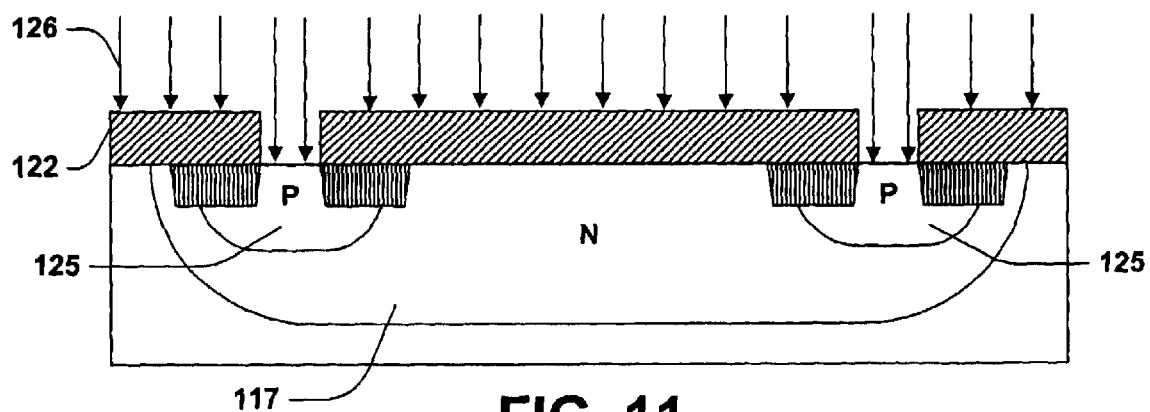
FIG. 11 is a fragmentary cross sectional diagram illustrating the formation of P-type well regions.

Referring back to FIG. 5, the next act, or event, is the formation of P-type well regions at 92. As shown in FIG. 10, a photoresist 122 is applied to the device surface. A mask 123 is then employed and the photoresist is subjected to UV radiation 124 via the mask 123 to form mask pattern 122, which exposes the first region 129 and the third region 128 in the N-well 117, respectively. Next, referring to FIG. 11, the N-well 117 is implanted with a P-type material 126 (for example, Boron) to form P-type well regions 125 within the deep N-well region 117. After this act, or event, the pattern is removed (e.g., the photoresist 122 is removed). It should be noted that acts or events described above are common to both the bipolar junction transistor formation and the CMOS transistor formation. In other words there is no need for additional masking operations at this point in the process (e.g., all the acts, or events, mentioned so far 90, 91, 92, are performed using masking operations utilized during standard BiCMOS and CMOS processing).

Figure 12:
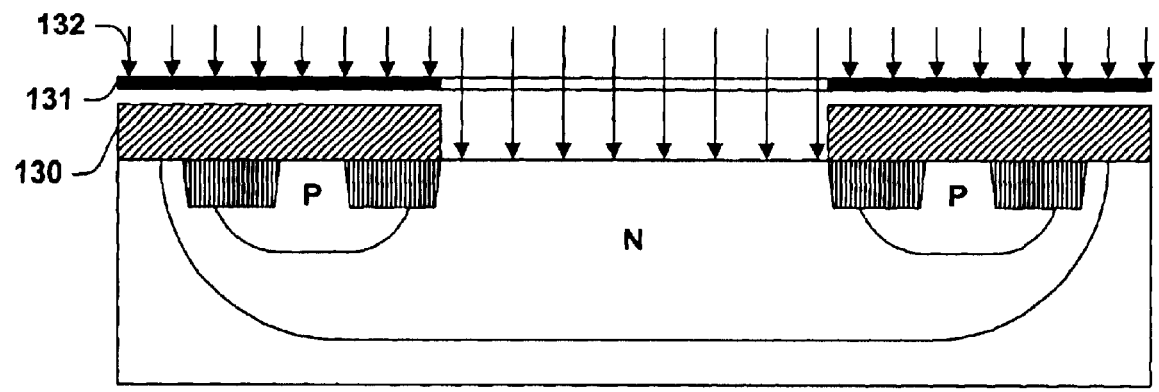
FIG. 12 is a fragmentary cross sectional diagram illustrating a masking operation used to form a custom P-type collector region.

Referring again to FIG. 5, the next act, or event of the method 88 is forming and pattering a mask at 93 which is used subsequently to form a customized P-type collector region 94 followed by an N-type base region 95. FIG. 12 illustrates the acts, or events, performed in order to pattern the customized collector region profile. A photoresist 130 is applied to the device surface, and a mask 131 is then employed to subject the photoresist to UV radiation 132 to form a mask pattern 130 that exposes the second region 127 in the substrate.

Figure 13:
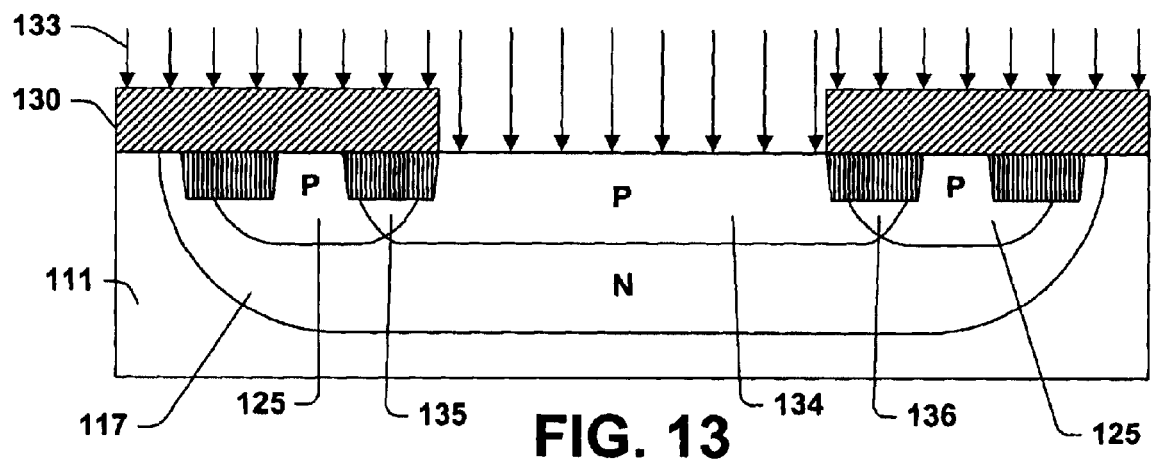
FIG. 13 is a fragmentary cross sectional diagram illustrating the formation of the P-type customized collector region.

Referring to FIG. 13, the N-well 117 is implanted with a customized dopant concentration of a P type material 133 (generally the region formed is a heavily doped, P+ type region) forming a P type customized collector region 134. Since the masking operation at 93 is specific to the formation of the collector region 134, the process controls associated with the customized collector region 134 (for example, dopant concentrations, geometric areas, gradients, etc.) are enhanced. In other words, the collector region 134 can be easily customized, or optimized, for desired bipolar transistor operating parameters, for example, to generate a retrograde profile in the collector region 134 at 94 (e.g., retrograde profiles refer to the fact that the highest dopant concentration in a well occurs at the bottom of the well rather then at the surface). In addition, since the collector region area 134 control is enhanced, the collector region 134 can be expanded laterally, to provide for a first overlapping region 135 and a second overlapping region 136, which couples the P type collector region 134 with the P type well regions 125, thereby reducing the transistor collector resistance. Finally, since the customized collector is formed independent of other CMOS process steps, the collector 134 has a dopant concentration and profile which is optimized specifically for the bipolar junction transistor.

Figure 14:
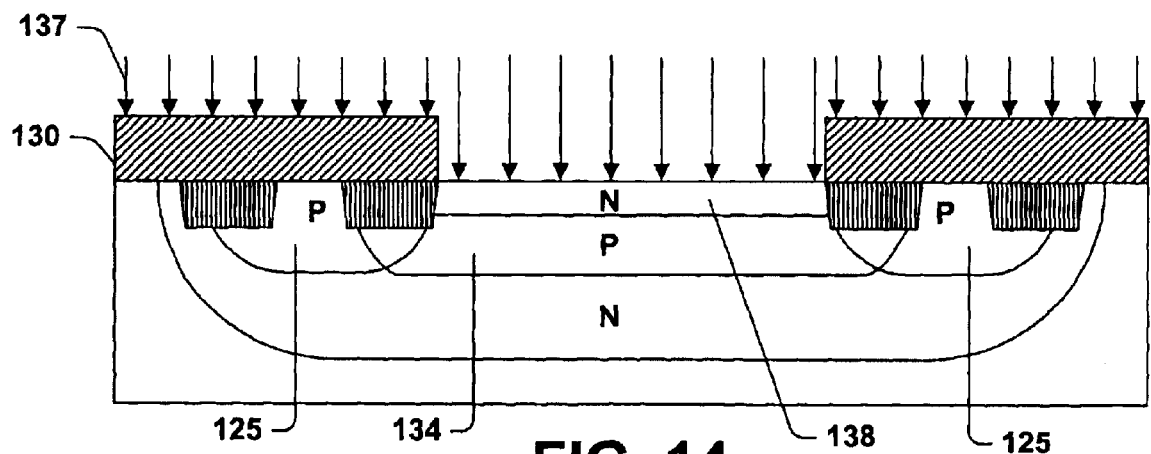
FIG. 14 is a fragmentary cross sectional diagram illustrating the formation of an N-type base region using the same mask as FIG. 13.

Referring to FIGS. 5 and 14, the next act, or event, is the formation of an N type base region at 95. Using the same mask pattern as was used with the P type collector 130 (and thus saving the expense of additional masking operations), the device is implanted with an N type material 137 to form an N type base region 138 (generally the region 138 is a heavily doped, N+ type region). After this act, or event, the pattern is removed (e.g., the photoresist 130 is removed). Note, that control of the N-type base is enhanced since the base implant 95 is specific to the bipolar device, but that forming the N-type base does not require an additional mask because process 95 uses the mask 130 also employed for the collector implant 94.

Figure 15:
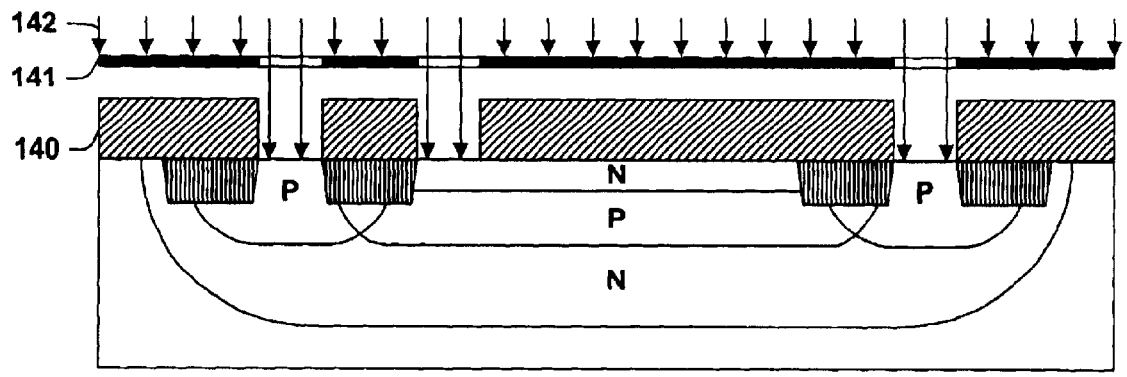
FIG. 15 is a fragmentary cross sectional diagram illustrating a masking operation used to form an emitter region and collector contact regions.

Referring back to FIG. 5, the next act, or event, is the formation of a P type (or PSD) emitter region and P type (or PSD) collector contact region at 96. The term PSD is illustrated in the figures as shorthand notation for P-type source/drain since the implant employed to form the emitter and collector contact regions is also used to form PMOS source/drain regions elsewhere on the die. FIG. 15 illustrates the acts, or events, performed in order to pattern the emitter region and the collector contact regions. A photoresist 140 is applied to the device surface. A mask 141 is then employed and the photoresist is selectively subjected to UV radiation 142 through the mask 141 to form a mask pattern 140.

Figure 16:
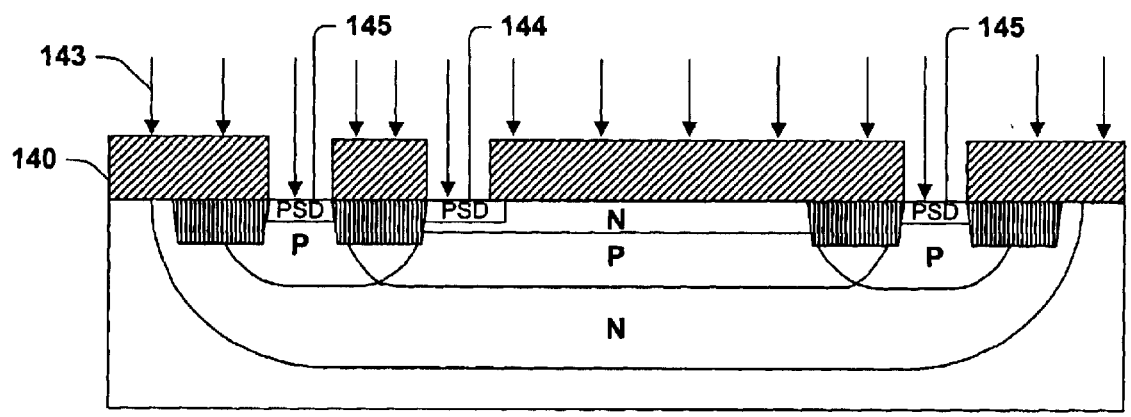
FIG. 16 is a fragmentary cross sectional diagram illustrating the formation of the emitter region and the collector contact regions.

Next, referring to FIG. 16, the device is implanted with a P-type material 143 forming a PSD implant for the emitter region 144 and PSD implants for the collector contact regions 145. Subsequently the pattern is removed (e.g., the photoresist 140 is removed). It should be noted that acts or events of implanting the emitter region and the collector regions, as described in FIGS. 15 and 16, are common to both the bipolar junction transistor formation and the CMOS transistor formation. In other words there is no need for additional masking operations to perform this act, or event (e.g., the acts, or events, described in FIGS. 15, 16 and FIG. 5 96, are performed using masking operations which are utilized during CMOS transistor formation).

Figure 17:
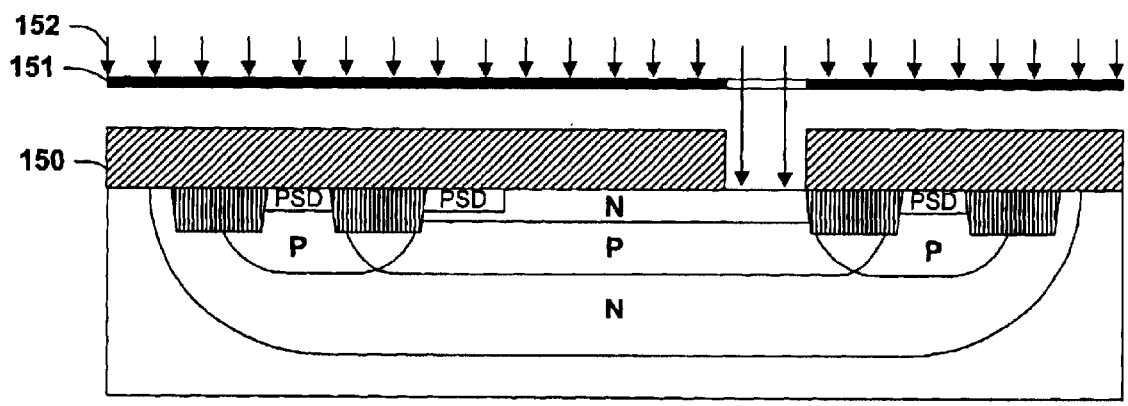
FIG. 17 is a fragmentary cross sectional diagram illustrating a masking operation used to form a base contact region.
Figure 18:
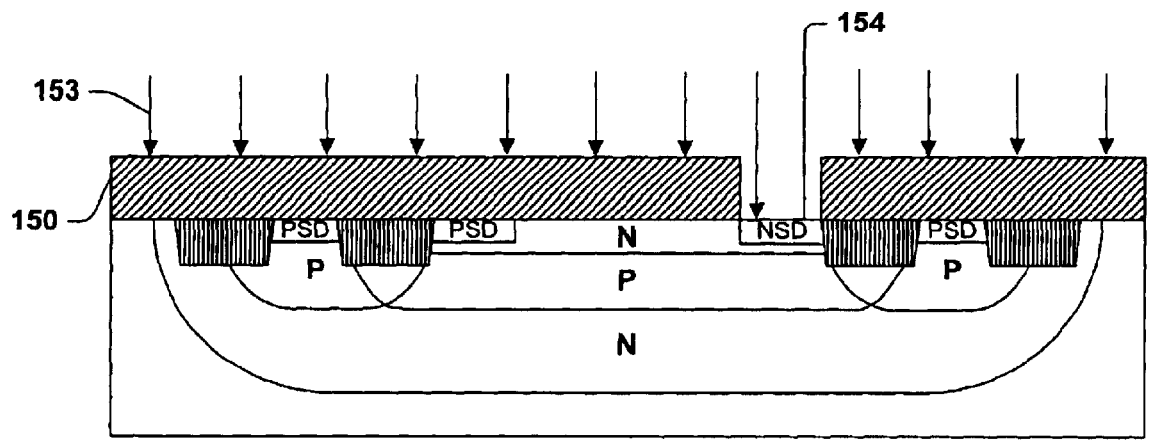
FIG. 18 is a fragmentary cross sectional diagram illustrating the formation of the base contact region.

Referring back to FIG. 5, the method 88 continues at 97 with the formation of the N type (or NSD) base region. FIG. 17 illustrates the acts, or events, performed in order to pattern the photoresist for base contact region implant. A photoresist 150 is applied to the device surface. A mask 151 is then employed and the photoresist is selectively subjected to UV radiation 152 via the mask 151 to form the mask pattern 150. Next, referring to FIG. 18, the device is implanted with an N-type material 153 forming an NSD implant for the base contact region 154. After this act, or event, the pattern is removed (e.g., the photoresist 150 is removed). It should be noted that the act, or event of implanting the base contact 154, as described in FIGS. 17 and 18, are common to both the bipolar junction transistor formation and the NMOS transistor source/drain formation (and hence the acronym NSD). In other words there is no need for additional masking operations to perform this act, or event (e.g., the acts, or events, described in FIGS. 17, 18 and FIG. 5 97). After 97, the pattern is removed (e.g., the photoresist 150 is removed).

Referring back to FIG. 5, the formation of an isolation region at 98 follows in order to block any potential suicide (or similar material) from shorting out the base and emitter. Alternatively this series of acts, or events, may be performed prior to the emitter and base implants previously described above, enhancing self-alignment of the regions, respectively. In addition, the isolation region may be omitted altogether (for example, if silicide located between the base region implant 154 and the emitter region 144 does not cause the transistor to be degraded or to perform in an inconsistent manner).

Figure 19:
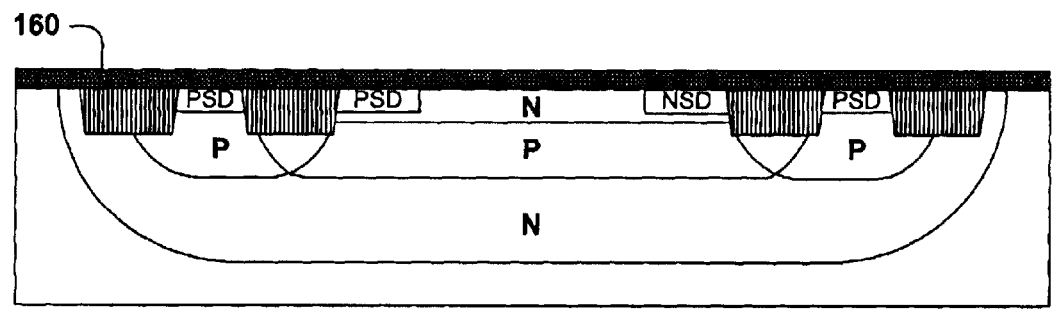
FIG. 19 is a fragmentary cross sectional diagram illustrating isolation material deposited on the transistor surface.
Figure 20:
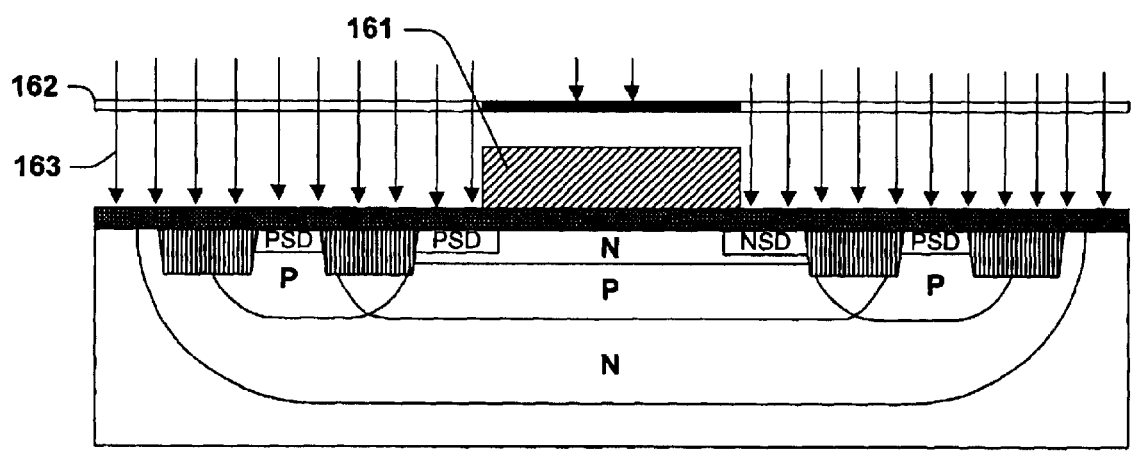
FIG. 20 is a fragmentary cross sectional diagram illustrating a masking operation used to form an isolation region.
Figure 21:
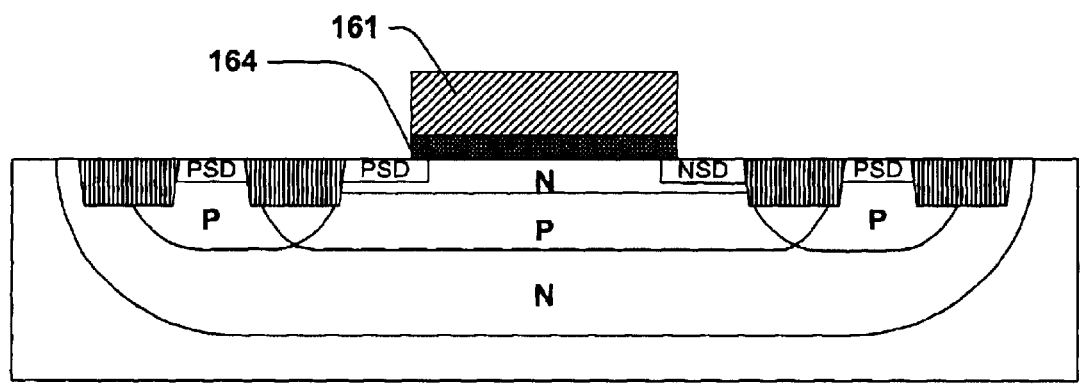
FIG. 21 is a fragmentary cross sectional diagram illustrating the formation of the isolation region.
Figure 22:
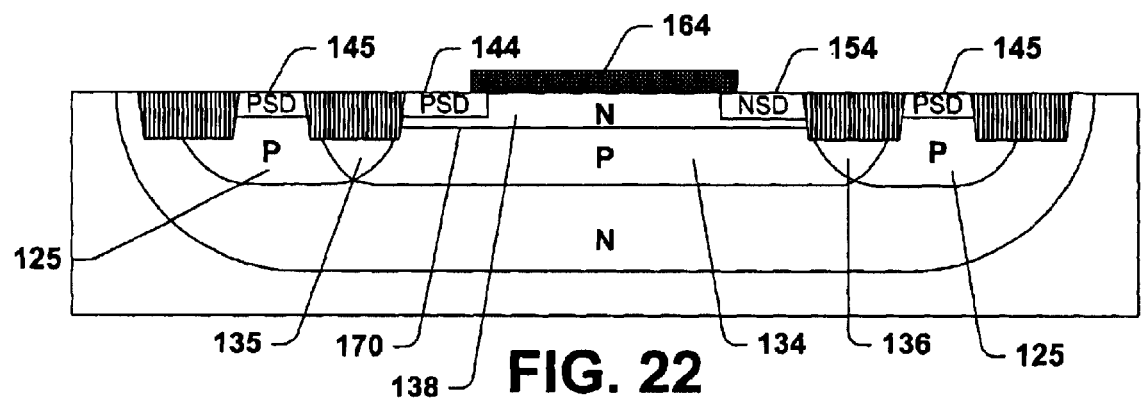
FIG. 22 is a cross sectional view of a completed PNP transistor in accordance with the present invention.

Referring to FIG. 19, a layer of isolation material (for example, $Si_3N_4$, $SiO_2$ or poly/gate oxide) 160 is deposited over the device surface. Next, as illustrated in FIG. 20, a photoresist 161 is applied to the device surface. A mask 162 is then employed and the photoresist is selectively subjected to UV radiation 163 via the mask 162 to form a mask pattern 161. The isolation material not protected by the photoresist mask pattern 161 is removed (for example, via an etching operation) leaving the remaining isolation material configured as illustrated in FIG. 21 164. After this act, or event, the pattern is removed (e.g., the photoresist 161 is removed) and the bipolar junction transistor formation is complete as illustrated in FIG. 22.

As noted above, using this novel inventive method 88, an optimized bipolar junction transistor can be easily formed within a BiCMOS and CMOS process using only one extra mask. Besides the cost savings associated with this inventive method (e.g., the cost savings associated with a one extra masking operation), the bipolar junction transistor of FIG. 22 is easily optimized for high performance because the P type collector region 134 may be dedicated solely to forming the vertical PNP collector region and thus may be retrograded and capable of providing a customized dopant (generally high P+ dopant) concentration deep into the device. In other words, this novel method makes the collector region 134 easy to customize. In addition, the retrograde profile of the collector region 134 allows for greater lateral expansion via coupling regions 135, 136 into the P well 125 regions, collectively forming a highly customized transistor collector region 134, 135, 136, 125.

Typical dopant concentrations for the N type base 138 can range from about $5 \times 10^{17}/cm^3$ to about $2 \times 10^{18}/cm^3$, typical dose ranges from about $3 \times 10^{12}/cm^2$ to about $2 \times 10^{13}/cm^2$, and typical energy ranging from about 5 Kev to about 25 Kev. Near the base/collector region junction 170, typical dopant concentrations in the collector region 134 may range from about $5 \times 10^{15}/cm^3$ to $1 \times 10^{17}/cm^3$. In addition, the base region 138 can be optimized for variations of source/drain (e.g., NSD 154 or PSD 144) implants having depths that can range from about 1000 angstroms to 5000 angstroms. This optimization results from the ability to optimize the base 138 without having to consider the collector profile 134. PSD 145, 144 and NSD 154 implants typically are formed with a dose of about $3 \times 10^{15}/cm^2$. PSD 145, 144 implants are typically implanted with Boron with an energy level of about 20 Kev. NSD 154 implants are typically implanted with a combination of Arsenic, at an energy level of about 4 Kev, and Phosphorus at an energy level of about 20 Kev.

Figure 23:
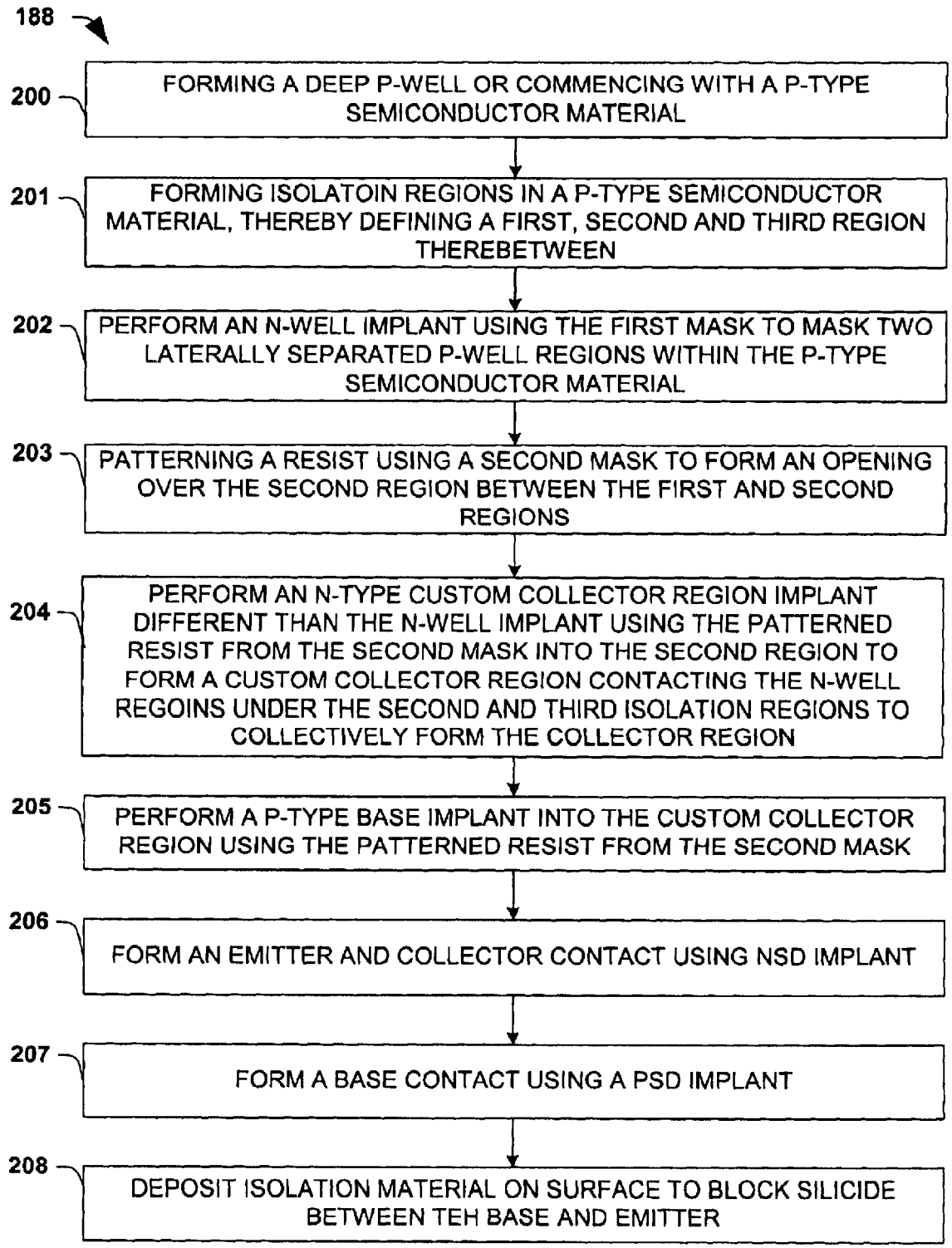
FIG. 23 is a flow diagram illustrating a method of forming a bipolar transistor in a BiCMOS and CMOS process according to another aspect of the present invention.

FIG. 23 is a flow chart, which in combination with FIGS. 24–40, illustrates an improved method 188 in accordance with one aspect of the present invention of fabricating a high performance bipolar transistor within a BiCMOS and CMOS process. The present invention is not limited by the illustrated ordering of the acts as some acts may occur in different orders and/or concurrently with other acts or events. In addition, all illustrated acts or events may not be required to implement a methodology in accordance with the present invention. In the following claims, the ordering of acts is only a limitation to the extent required explicitly or dictated by internal references within the claims.

Figure 24:
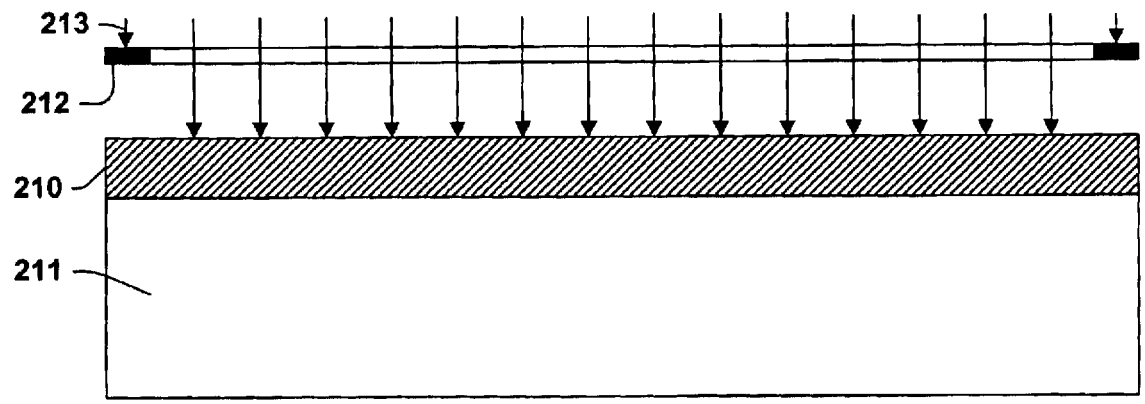
FIG. 24 is a fragmentary cross sectional diagram illustrating a masking operation to form a deep P-well.
Figure 25:
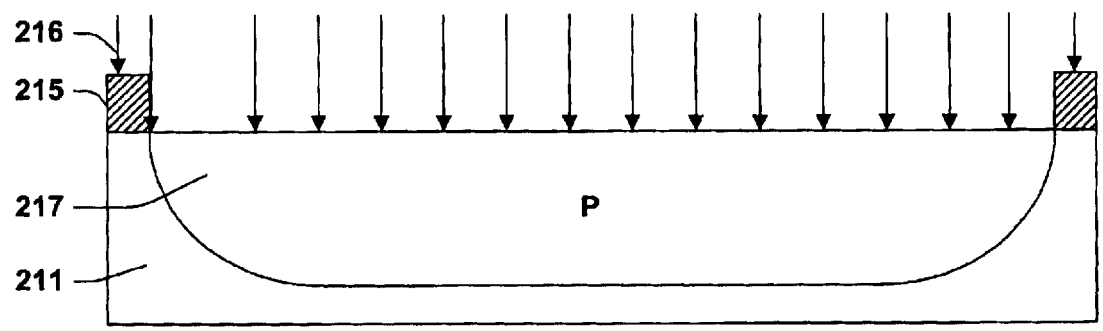
FIG. 25 is a fragmentary cross sectional diagram illustrating the formation of a deep P-well.

Referring to FIG. 23, a deep P-well is formed within a substrate at 90. Alternately, the process 188 may commence with a P-type semiconductor material depending on the isolation method or the isolation requirements of the bipolar junction transistor. FIGS. 24 and 25 illustrate this process in detail. Referring to FIG. 24, a photoresist 210 is applied to the surface of a substrate material 211. A mask 212 is then employed and the photoresist is selectively subjected to UV radiation 213 via the mask to form a mask pattern upon development, as illustrated in FIG. 25 215. Next, the substrate 211 is implanted with a P-type material 216 to form a deep P-type well 217. After this act, or event, the pattern is removed (e.g., the photoresist 215 is removed).

Figure 26:
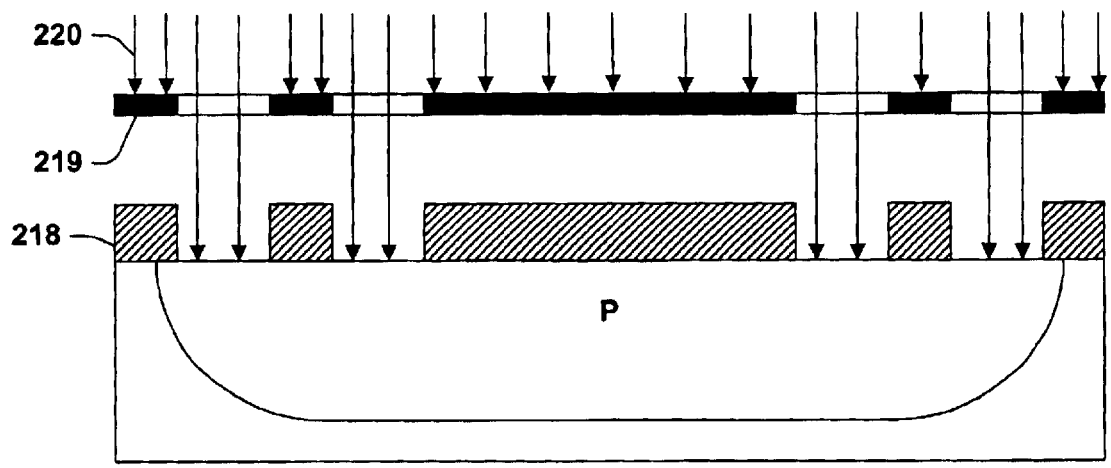
FIG. 26 is a fragmentary cross sectional diagram illustrating a masking operation used to form shallow trench isolation regions.
Figure 27:
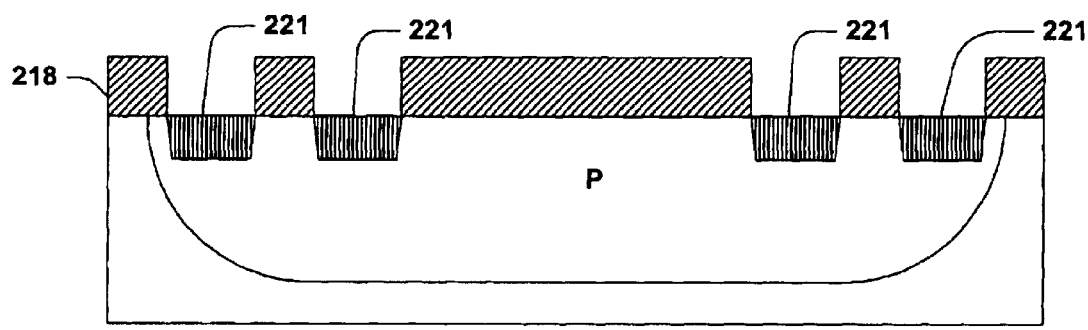
FIG. 27 is a fragmentary cross sectional diagram illustrating the shallow trench isolation regions.

Referring back to FIG. 23, the next act or event comprises the formation of electrical isolation regions at 201. This formation may be performed for example using either shallow trench isolation methods, LOCOS, or any other similar method. FIGS. 26 and 27 detail a portion of the formation of the isolation regions 221 using a shallow trench isolation method. Referring to FIG. 26, a photoresist 218 is applied to the device surface. A mask 219 is then employed and the photoresist is subjected to UV radiation 220 via the mask to form a mask pattern 218. Next, referring to FIG. 27, trenches are etched using the mask pattern 218 and the trenches are subsequently filled with isolation material (for example, $SiO_2$ or another similar material), thereby forming the trench isolation regions 221. After this act, or event, the pattern is removed (e.g., the photoresist 218 is removed). Note, referring to FIG. 28, a first 229, a second 227, and a third 228 region are defined by the isolation regions as described in FIG. 23 201 and is illustrated for clarity.

Figure 28:
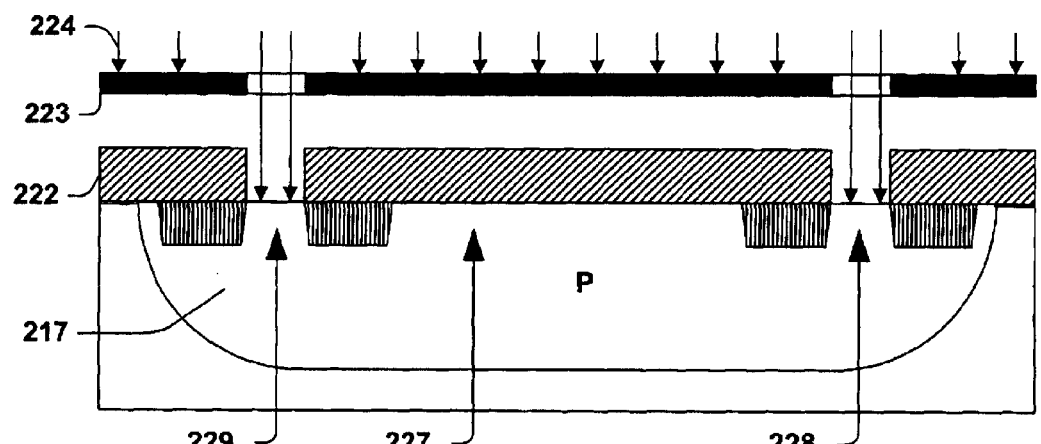
FIG. 28 is a fragmentary cross sectional diagram illustrating a masking operation used to form N-type well regions.
Figure 29:
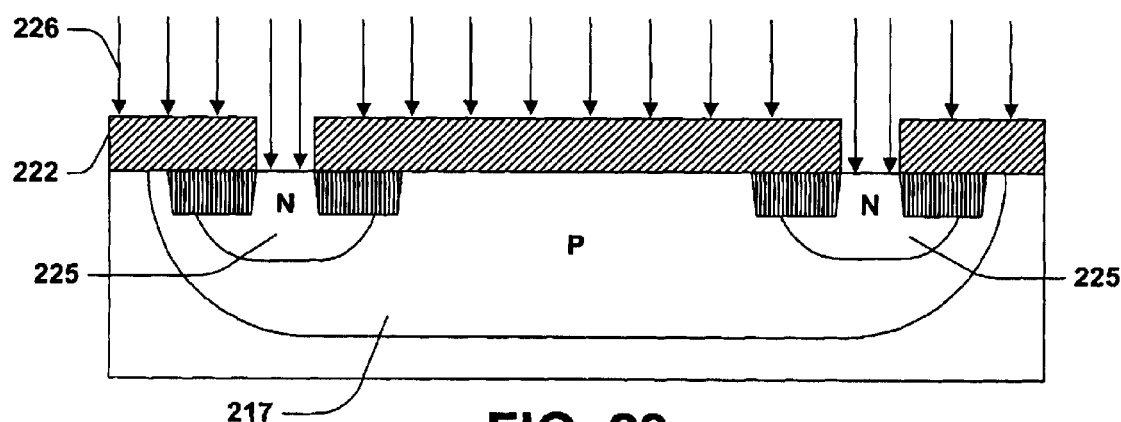
FIG. 29 is a fragmentary cross sectional diagram illustrating the formation of N-type well regions.

Referring back to FIG. 23, the next act, or event, is the formation of N-type well regions at 202. As shown in FIG. 28, a photoresist 222 is applied to the device surface. A mask 223 is then employed and the photoresist is subjected to UV radiation 224 via the mask 223 to form mask pattern 222, which exposes the first region 229 and the third region 228 in the P-well 217, respectively. Next, referring to FIG. 29, the P-well 217 is implanted with an N-type material 226 (for example, Phosphorus) to form N-type well regions 225 within the deep P-well region 217. After this act, or event, the pattern is removed (e.g., the photoresist 222 is removed). It should be noted that acts or events described above are common to both the bipolar junction transistor formation and the CMOS transistor formation. In other words there is no need for additional masking operations at this point in the process (e.g., all the acts, or events, mentioned so far 200, 201, 202, are performed using masking operations utilized during standard BiCMOS and CMOS processing).

Figure 30:
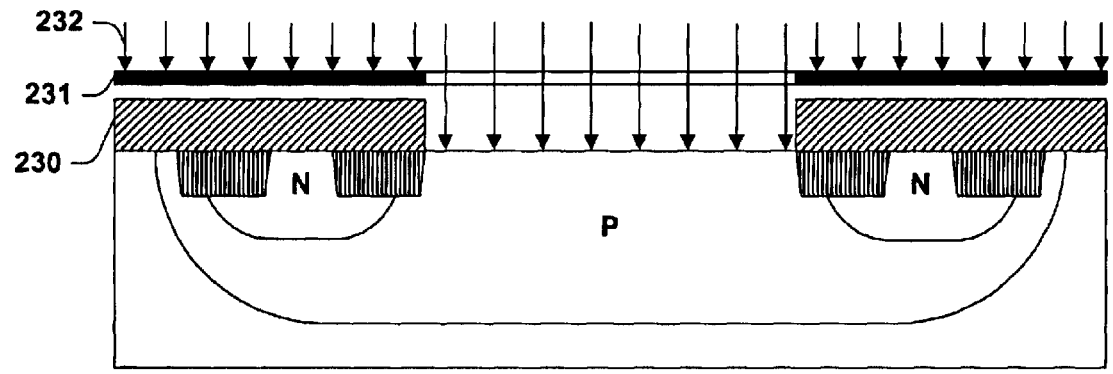
FIG. 30 is a fragmentary cross sectional diagram illustrating a masking operation used to form a custom N-type collector region.

Referring again to FIG. 23, the next act, or event of the method 188 is forming and pattering a mask at 203 which is used subsequently to form a customized N-type collector region 204 followed by a P-type base region 205. FIG. 30 illustrates the acts, or events, performed in order to pattern the customized collector region profile. A photoresist 230 is applied to the device surface, and a mask 231 is then employed to subject the photoresist to UV radiation 232 to form a mask pattern 230 that exposes the second region 227 in the substrate.

Figure 31:
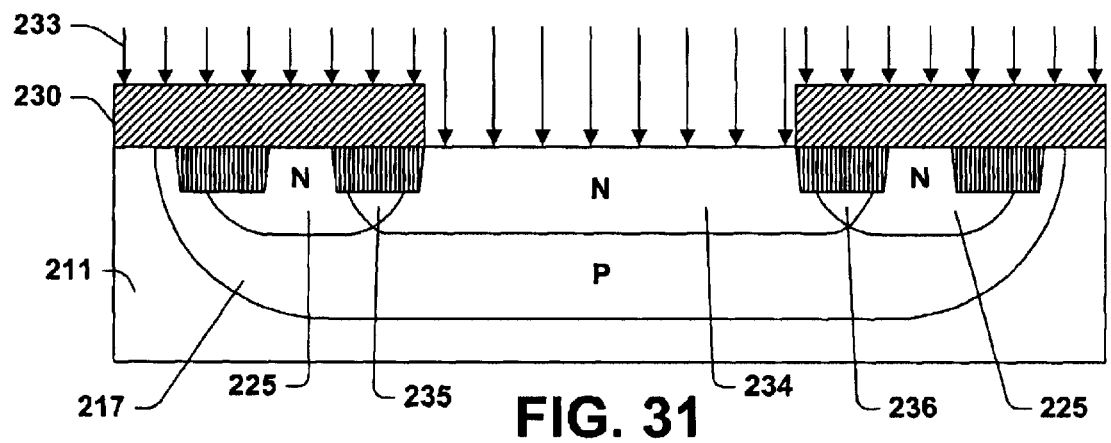
FIG. 31 is a fragmentary cross sectional diagram illustrating the formation of the N-type customized collector region.

Referring to FIG. 31, the P-well 217 is implanted with a customized dopant concentration of an N type material 233 (generally the region formed is a heavily doped, N+ type region) forming an N type customized collector region 234. Since the masking operation at 203 is specific to the formation of the collector region 234, the process controls associated with the customized collector region 234 (for example, dopant concentrations, geometric areas, gradients, etc.) are enhanced. In other words, the collector region 234 can be easily customized, or optimized, for desired bipolar transistor operating parameters, for example, to generate a retrograde profile in the collector region 234 at 204 (e.g., retrograde profiles refer to the fact that the highest dopant concentration in a well occurs at the bottom of the well rather then at the surface). In addition, since the collector region area 234 control is enhanced, the collector region 234 can be expanded laterally, to provide for a first overlapping region 235 and a second overlapping region 236, which couples the N type collector region 234 with the N type well regions 225, thereby reducing the transistor collector resistance. Finally, since the customized collector is formed independent of other CMOS process steps, the collector 234 has a dopant concentration and profile which is optimized specifically for the bipolar junction transistor.

Figure 32:
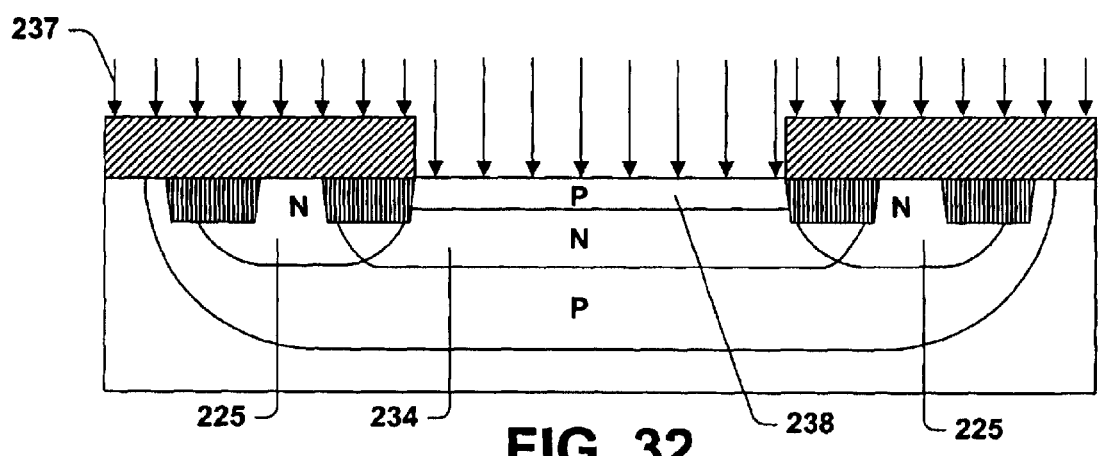
FIG. 32 is a fragmentary cross sectional diagram illustrating the formation of a P-type base region using the same mask as FIG. 31.

Referring to FIGS. 23 and 32, the next act, or event, is the formation of a P type base region at 205. Using the same mask pattern as was used with the N type collector 230 (and thus saving the expense of additional masking operations), the device is implanted with a P type material 237 to form a P type base region 238 (generally the region 238 is a heavily doped, P+ type region). After this act, or event, the pattern is removed (e.g., the photoresist 230 is removed). Note, that control of the P-type base is enhanced since the base implant 205 is specific to the bipolar device, but that forming the P-type base does not require an additional mask because process 205 uses the mask 230 also employed for the collector implant 204.

Figure 33:
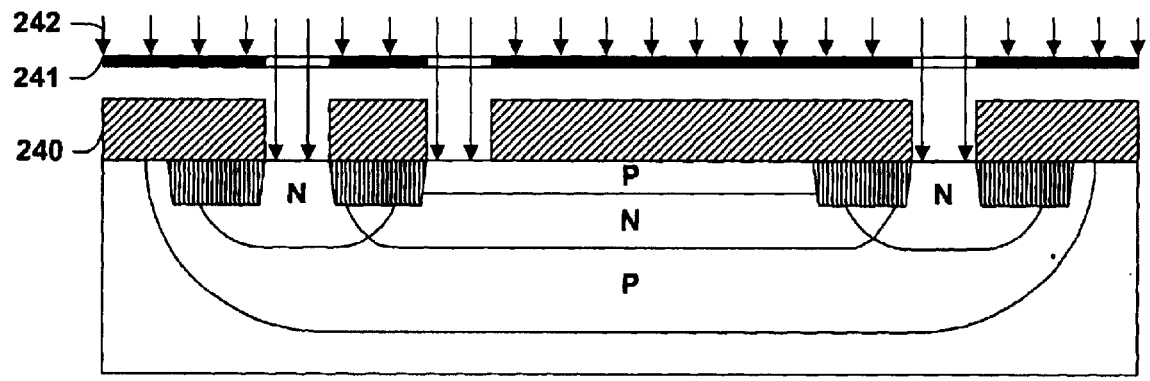
FIG. 33 is a fragmentary cross sectional diagram illustrating a masking operation used to form an emitter region and collector contact regions.

Referring back to FIG. 23, the next act, or event, is the formation of a N type (or NSD) emitter region and N type (or NSD) collector contact region at 206. The term NSD is illustrated in the figures as shorthand notation for N-type source/drain since the implant employed to form the emitter and collector contact regions is also used to form NMOS source/drain regions elsewhere on the die. FIG. 33 illustrates the acts, or events, performed in order to pattern the emitter region and the collector contact regions. A photoresist 240 is applied to the device surface. A mask 241 is then employed and the photoresist is selectively subjected to UV radiation 242 through the mask 241 to form a mask pattern 240.

Figure 34:
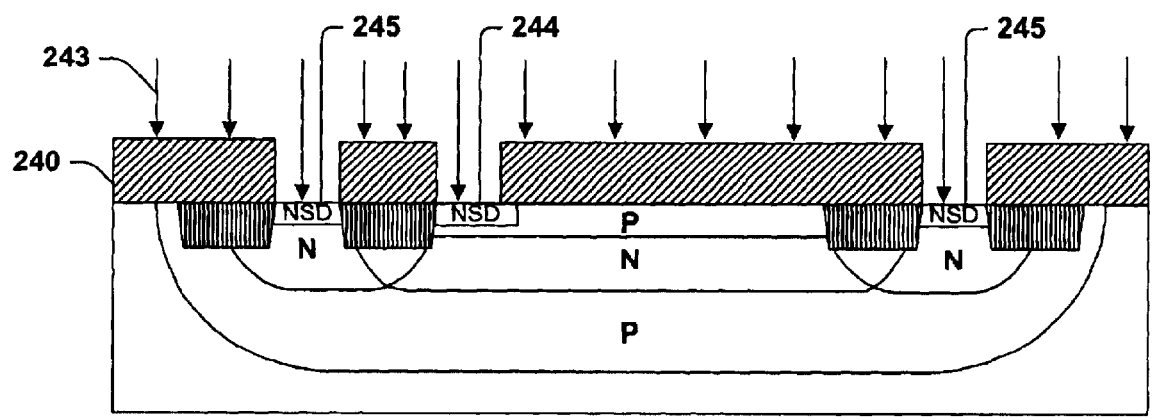
FIG. 34 is a fragmentary cross sectional diagram illustrating the formation of the emitter region and the collector contact regions.

Next, referring to FIG. 34, the device is implanted with a N-type material 243 forming a NSD implant for the emitter region 244 and NSD implants for the collector contact regions 245. Subsequently the pattern is removed (e.g., the photoresist 240 is removed). It should be noted that acts or events of implanting the emitter region and the collector regions, as described in FIGS. 33 and 34, are common to both the bipolar junction transistor formation and the CMOS transistor formation. In other words there is no need for additional masking operations to perform this act, or event (e.g., the acts, or events, described in FIGS. 33, 34 and FIG. 23 206, are performed using masking operations which are utilized during CMOS transistor formation).

Figure 35:
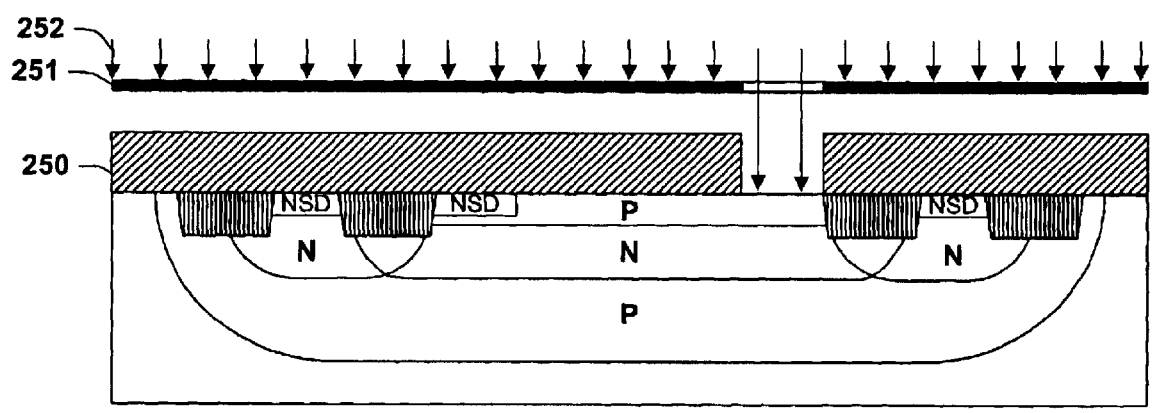
FIG. 35 is a fragmentary cross sectional diagram illustrating a masking operation used to form a base contact region.
Figure 36:
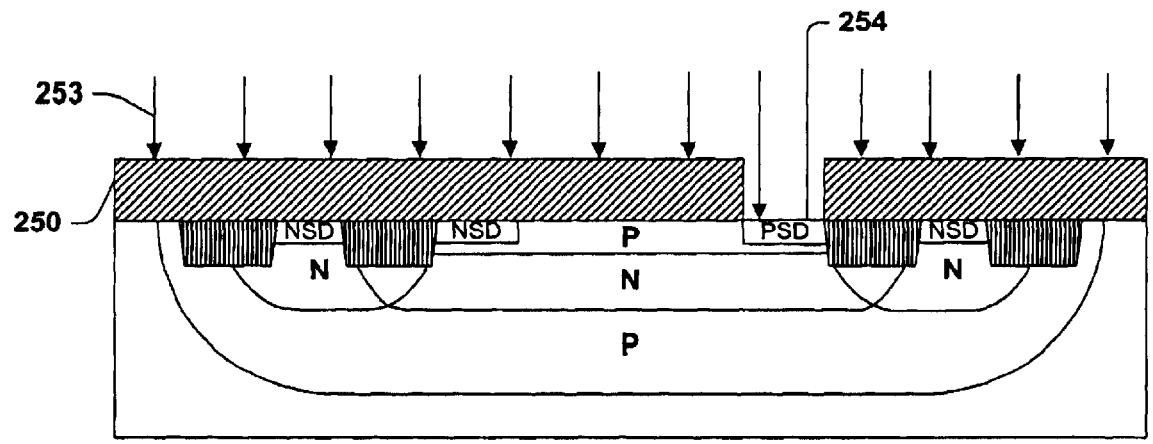
FIG. 36 is a fragmentary cross sectional diagram illustrating the formation of the base contact region.

Referring back to FIG. 23, the method 188 continues at 207 with the formation of the P type (or PSD) base region. FIG. 35 illustrates the acts, or events, performed in order to pattern the photoresist for base contact region implant. A photoresist 250 is applied to the device surface. A mask 251 is then employed and the photoresist is selectively subjected to UV radiation 252 via the mask 251 to form the mask pattern 250. Next, referring to FIG. 36, the device is implanted with an P-type material 253 forming an PSD implant for the base 254 contact region. After this act, or event, the pattern is removed (e.g., the photoresist 250 is removed). It should be noted that the act, or event of implanting the base contact 254, as described in FIGS. 35 and 36, are common to both the bipolar junction transistor formation and the PMOS transistor source/drain formation (and hence the acronym PSD). In other words there is no need for additional masking operations to perform this act, or event (e.g., the acts, or events, described in FIGS. 35, 36 and FIG. 23 207). After 97, the pattern is removed (e.g., the photoresist 250 is removed).

Figure 37:
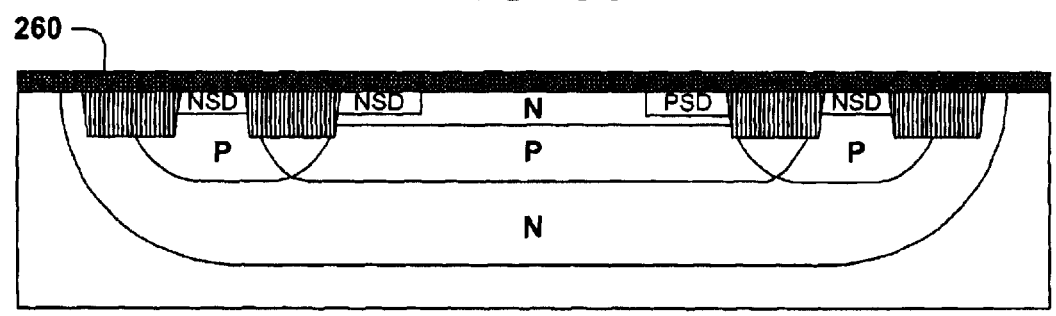
FIG. 37 is a fragmentary cross sectional diagram illustrating isolation material deposited on the transistor surface.
Figure 38:
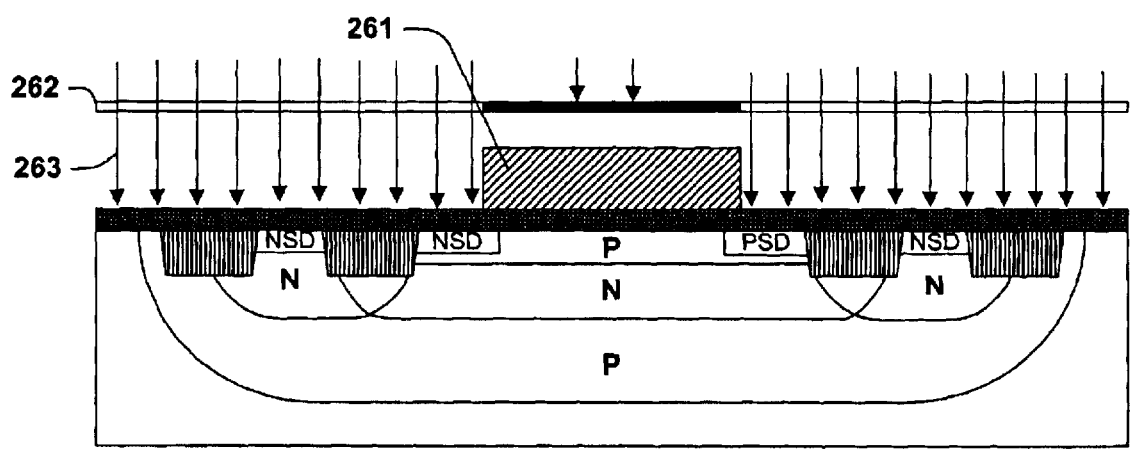
FIG. 38 is a fragmentary cross sectional diagram illustrating a masking operation used to form an isolation region.
Figure 39:
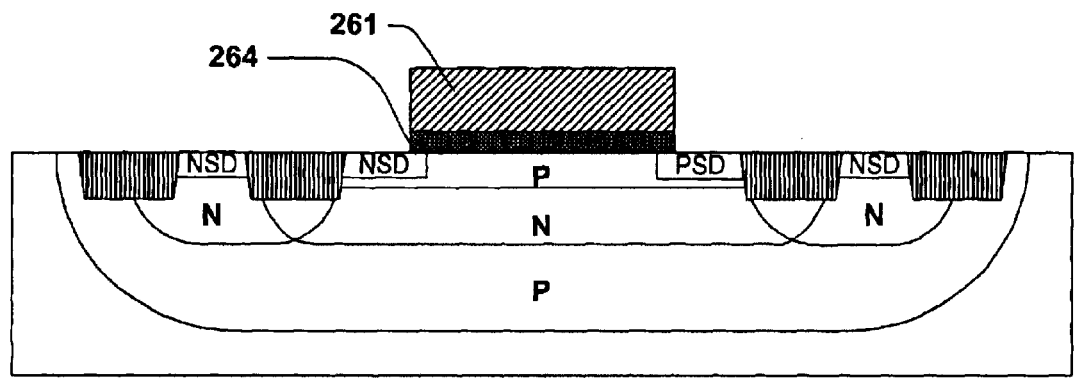
FIG. 39 is a fragmentary cross sectional diagram illustrating the formation of the isolation region.
Figure 40:
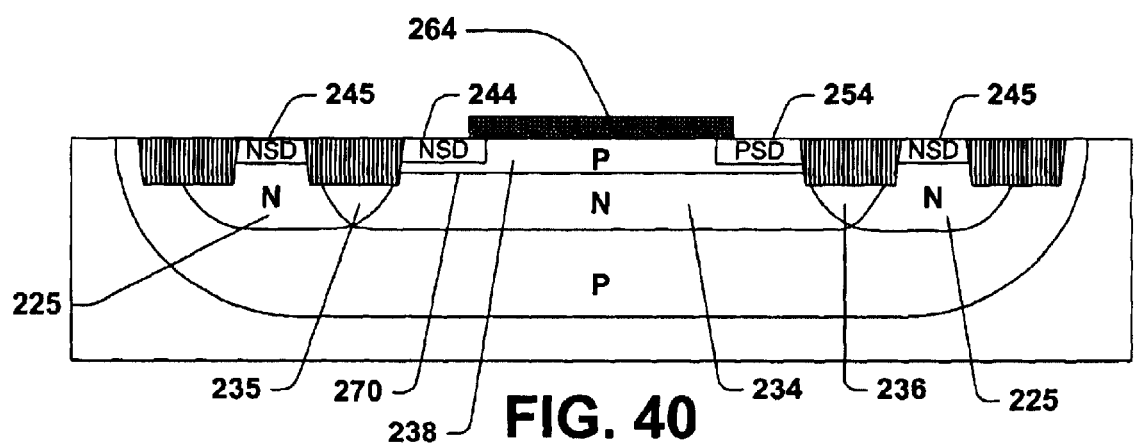
FIG. 40 is a cross sectional view of a completed NPN transistor in accordance with the present invention.

Referring back to FIG. 23, the formation of an isolation region at 208 follows in order to block any potential silicide (or similar material) from shorting out the base and emitter. Alternatively this series of acts, or events, may be performed prior to the emitter and base implants previously described above, enhancing self-alignment of the regions, respectively. In addition, the isolation region may be omitted altogether (for example, if silicide located between the base region implant 254 and the emitter region 244 does not cause the transistor to be degraded or to perform in an inconsistent manner). Referring to FIG. 37, a layer of isolation material (for example, $Si_3N_4$, $SiO_2$ or poly/gate oxide) 260 is deposited over the device surface. Next, as illustrated in FIG. 38, a photoresist 261 is applied to the device surface. A mask 262 is then employed and the photoresist is selectively subjected to UV radiation 263 via the mask 262 to form a mask pattern 261. The isolation material not protected by the photoresist mask pattern 261 is removed (for example, via an etching operation) leaving the remaining isolation material configured as illustrated in FIG. 39 264. After this act, or event, the pattern is removed (e.g., the photoresist 261 is removed) and the bipolar junction transistor formation is complete as illustrated in FIG. 40.

As noted above, using this novel inventive method 188, an optimized bipolar junction transistor can be easily formed within a BiCMOS and CMOS process using only one extra mask. Besides the cost savings associated with this inventive method (e.g., the cost savings associated with a one extra masking operation), the bipolar junction transistor of FIG. 40 is easily optimized for high performance because the N type collector region 234 may be dedicated solely to forming the vertical NPN collector region and thus may be retrograded and capable of providing a customized dopant (generally high N+ dopant) concentration deep into the device. In other words, this novel method makes the collector region 234 easy to customize. In addition, the retrograde profile of the collector region 234 allows for greater lateral expansion via coupling regions 235, 236 into the N well 225 regions, collectively forming a highly customized transistor collector region 234, 235, 236, 225.

Typical dopant concentrations for the P type base 238 can range from about $5 \times 10^{17}/cm^3$ to about $2 \times 10^{18}/cm^3$, typical dose ranges from about $3 \times 10^{12}/cm^2$ to about $2 \times 10^{13}/cm^2$, and typical energy ranging from about 5 Kev to about 25 Kev. Near the base/collector region junction 170, typical dopant concentrations in the collector region 234 may range from about $5 \times 10^{15}/cm^3$ to $1 \times 10^{17}/cm^3$. In addition, the base region 238 can be optimized for variations of source/drain (e.g., PSD 254 or NSD 244) implants having depths that can range from about 1000 Angstroms to 5000 Angstroms. This optimization results from the ability to optimize the base 238 without having to consider the collector profile 234. NSD 245, 244 and PSD 254 implants typically are formed with a dose of about $3 \times 10^{15}/cm^2$. PSD 254 implants are typically implanted with Boron with an energy level of about 20 Kev. NSD 245, 244 implants are typically implanted with a combination of Arsenic, at an energy level of about 4 Kev, and Phosphorus at an energy level of about 20 Kev.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (ie., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming a PNP bipolar transistor, comprising:
    forming four isolation regions in an n-type semiconductor material, thereby defining a first, second and third region between the four isolation regions, respectively;
    forming and patterning a first mask to expose two laterally separated openings over the n-type semiconductor material, the two openings corresponding to the first and third regions in the n-type semiconductor material;
    performing a P-well implant using the first mask to form two laterally separated P-well regions within the n-type semiconductor material;
    removing the first mask;
    forming and patterning a second mask to expose an opening over the second region between the first and third regions;
    performing a p-type custom collector region implant different than the P-well implant using the second mask into the second region, thereby forming a custom collector region contacting the P-well regions under the second and third isolation regions, respectively to collectively form a collector region of the PNP bipolar transistor;
    performing an n-type base implant using the second mask, thereby forming an n-type base region in the custom collector region.

2. The method of claim 1, wherein the n-type semiconductor material comprise a deep N-well within a p-type semiconductor substrate.

3. The method of claim 1, wherein the P-type custom collector region comprise a retrograde P-type dopant profile, wherein the dopant concentration is lower at a top surface of the P-type custom collector region than at the bottom portion thereof.

4. The method of claim 3, wherein the N-type base region comprises a dopant concentration range from about $5 \times 10^{17}/cm^3$ to about $2 \times 10^{18}/cm^3$.

5. The method of claim 4, wherein the P-type emitter region is formed via ion implantation with a dose of about $3 \times 10^{15}/cm^2$.

6. The method of claim 5, wherein the P-type emitter contact region is formed with an implantation energy of about 20 Kev.

7. The method of claim 1, comprising:
    forming a P-type emitter region in the n-type base region, wherein the P-type emitter region resides at a top surface of the semiconductor material;
    forming an N-type base contact region in the n-type base region, wherein the N-type base contact region is different then the N-type base region, and the N-type base contact region resides at the top surface of the semiconductor material and is laterally spaced apart from the P-type emitter region; and
    forming a P-type collector contact region in at least one of the P-well regions, wherein the P-type collector contact region is different then the P-well region and the P-type collector contact region resides at the top surface of the semiconductor material in one of the first and third region.

8. The method of claim 1, wherein the four isolation regions are formed using a shallow trench isolation process.

9. A method of forming an NPN bipolar transistor, comprising:
    forming four isolation regions in a p-type semiconductor material, thereby defining a first, second and third region between the four isolation regions, respectively;
    forming and patterning a first mask to expose two laterally separated openings over the p-type semiconductor material the two openings corresponding to the first and third n-type regions in the p-type semiconductor material;
    performing a N-well implant using the first mask to form two laterally separated N-well regions within the p-type semiconductor material;
    removing the first mask;
    forming and patterning a second mask to expose an opening over the second region between the first and third regions;
    performing an n-type custom collector region implant different than the N-well implant using the second mask into the second region, thereby forming a custom collector region contacting the N-well regions under the second and third isolation regions, respectively to collectively form a collector region of the NPN bipolar transistor;
    performing a p-type base implant using the second mask, thereby forming a p-type base region in the custom collector region.

10. The method of claim 9, wherein the p-type semiconductor material comprise a deep P-well within a n-type semiconductor substrate.

11. The method of claim 9, wherein the N-type custom collector region comprise a retrograde N-type dopant profile, wherein the dopant concentration is lower at a top surface of the N-type custom collector region than at a bottom portion thereof.

12. The method of claim 11, wherein the P-type base region comprises a dopant concentration range from about $5 \times 10^{17}/cm^3$ to about $2 \times 10^{18}/cm^3$.

13. The method of claim 12, wherein the N-type emitter region is formed via ion implantation with a dose of about $3 \times 10^{15}/cm^2$.

14. The method of claim 13, wherein the N-type emitter contact region is formed with an implantation energy of about 20 Kev.

15. The method of claim 9, comprising:
    forming an N-type emitter region in the p-type base region, wherein the N-type emitter region resides at a top surface of the semiconductor material;
    forming a P-type base contact region in the p-type base region, wherein the P-type base contact region is different then the P-type base region, and the P-type base contact region resides at the top surface of the semiconductor material and is laterally spaced apart from the n-type emitter region; and
    forming an N-type collector contact region in at least one of the N-well regions, wherein the N-type collector contact region is different then the N-well region and the N-type collector contact region resides at the top surface of the semiconductor material in one of the first and third region.

16. The method of claim 9, wherein the four isolation regions are formed using a shallow trench isolation process.

17. A method of forming a vertical bipolar transistor, comprising:
    forming at least two isolation regions in a top surface of a semiconductor material having a first conductivity type, thereby defining three regions therein, wherein a second region resides between the two isolation regions, and the first and third regions resides on opposing sides of the two isolation regions, respectively;
    forming well regions in the first and third regions using a first mask, wherein the well regions comprise a second conductivity type and have a first dopant concentration;
    forming a custom collector region in the second region using a second mask, wherein the custom collector region comprises the second conductivity type and has a second dopant concentration, and wherein the custom collector region contacts the well regions under the two isolation regions to form a collector region;
    forming a base region within the custom collector region using the second mask, wherein the base region comprises the first conductivity type;
    concurrently forming a collector contact region in at least one of the well regions and an emitter region within the base region using a third mask, the collector contact region and the emitter region having the second conductivity type and a third dopant concentration; and
    forming a base contact region within the base region using a fourth mask, wherein the base contact region comprises the first conductivity type and a fourth dopant concentration and is spaced laterally away from the emitter region.

18. The method of claim 17, wherein the first conductivity type comprises an n-type semiconductor material, and the second conductivity type comprises a p-type semiconductor material.

19. The method of claim 17, wherein the first and second dopant concentrations are different.

20. The method of claim 19, wherein the second dopant concentration is greater than the first dopant concentration.

21. The method of claim 17, wherein the second dopant concentration associated with the custom collector region comprises a retrograde dopant concentration profile, wherein a dopant concentration at a top portion of the custom collector region near the base region is less than a bottom portion thereof.

22. The method of claim 21, wherein the second dopant concentration associated with the custom collector region comprises a dopant concentration range from about $5 \times 10^{15}/cm^3$ to about $1 \times 10^{17}/cm^3$.

23. The method of claim 17, wherein the third mask employed to form the collector contact region and the emitter region is concurrently used to form source and drain regions for a first MOS type transistor elsewhere in the semiconductor material.

24. The method of claim 23, wherein the fourth mask employed to form the base contact region is concurrently used to form source and drain regions for a second MOS type transistor elsewhere in the semiconductor material.

25. The method of claim 17, further comprising forming an electrically insulating region on the top surface of the semiconductor material, wherein at least a portion of the electrically insulting region is located generally between the base region and the emitter region.

* * * * *